US010319940B2

(12) United States Patent
Ide et al.

(10) Patent No.: US 10,319,940 B2
(45) Date of Patent: Jun. 11, 2019

(54) ORGANIC ELECTROLUMINISCENT DISPLAY DEVICE WITH ARRANGEMENT OF DUMMY INTERCONNECTIONS

(71) Applicant: Futaba Corporation, Mobara-shi, Chiba (JP)

(72) Inventors: Shinji Ide, Mobara (JP); Ikuo Ohmori, Kitaibaraki (JP); Nobuko Hayakawa, Kitaibaraki (JP)

(73) Assignee: FUTABA CORPORATION, Chiba (JP)

( * ) Notice: Subject to any disclaimer, the term of this patent is extended or adjusted under 35 U.S.C. 154(b) by 146 days.

(21) Appl. No.: 15/286,199

(22) Filed: Oct. 5, 2016

(65) Prior Publication Data
US 2017/0104175 A1  Apr. 13, 2017

(30) Foreign Application Priority Data

Oct. 8, 2015 (JP) .................................. 2015-200094

(51) Int. Cl.
*H05B 33/06* (2006.01)
*H01L 27/32* (2006.01)
(Continued)

(52) U.S. Cl.
CPC ...... *H01L 51/5246* (2013.01); *H01L 27/3223* (2013.01); *H01L 51/0096* (2013.01);
(Continued)

(58) Field of Classification Search
CPC ............. H01L 27/3223; H01L 51/5203; H01L 51/5246; H01L 27/3276; H01L 27/3288; H05B 33/06
See application file for complete search history.

(56) References Cited

U.S. PATENT DOCUMENTS

2004/0259326 A1* 12/2004 Hideo ............... G02F 1/136277
                                                438/458
2006/0261734 A1* 11/2006 Lee ..................... H01L 27/3223
                                                313/512
(Continued)

FOREIGN PATENT DOCUMENTS

JP      1-085779 U    6/1989
JP      5-030841 U    4/1993
(Continued)

OTHER PUBLICATIONS

English machine translation of JP2015-109241A of record.*
English machine translation of JP2005-019151A of record.*

*Primary Examiner* — Mohsen Ahmadi
*Assistant Examiner* — Christopher M Roland
(74) *Attorney, Agent, or Firm* — Hamre, Schumann, Mueller & Larson, P.C.

(57) ABSTRACT

An organic EL display device includes a rectangular first substrate, an organic EL diode unit formed on the first substrate, a rectangular second substrate formed on the organic EL diode unit, a frame-shaped adhesive section configured to attach the first substrate to the second substrate to surround the organic EL diode unit, an extraction interconnection group constituted by a plurality of extraction interconnections extracted from the organic EL diode unit, and a dummy interconnection group formed at an adhesive region at which the adhesive section of the first substrate is attached and constituted by a plurality of dummy interconnections that are separated from each other, wherein the extraction interconnection and the dummy interconnection cross the adhesive section in the same direction.

17 Claims, 15 Drawing Sheets

(51) Int. Cl.
*H01L 51/52* (2006.01)
*H01L 51/00* (2006.01)

(52) U.S. Cl.
CPC .......... *H01L 51/52* (2013.01); *H01L 51/5203* (2013.01); *H01L 51/5259* (2013.01); *H01L 27/3276* (2013.01); *H01L 27/3288* (2013.01); *H01L 2251/558* (2013.01); *H05B 33/06* (2013.01); *Y02E 10/549* (2013.01); *Y02P 70/521* (2015.11)

(56) References Cited

U.S. PATENT DOCUMENTS

2007/0247582 A1* 10/2007 Mochizuki ............ G02F 1/1345
349/149
2009/0011678 A1* 1/2009 Morikawa ........... H01L 27/3223
445/25
2014/0319528 A1* 10/2014 Kesho ................. H01L 27/3223
257/59

FOREIGN PATENT DOCUMENTS

| | | | | |
|---|---|---|---|---|
| JP | 2000-243556 | 9/2000 | | |
| JP | 2001-189190 | 7/2001 | | |
| JP | 2003249347 A | * 9/2003 | ......... H01L 27/3223 |
| JP | 2005-019151 | 1/2005 | | |
| JP | 2009-238695 | 10/2009 | | |
| JP | 2015109241 | 6/2015 | | |
| TW | 201118486 | 6/2011 | | |
| WO | 2010/093013 | 8/2010 | | |
| WO | 2013/005401 | 1/2013 | | |

* cited by examiner

ORGANIC ELECTROLUMINISCENT DISPLAY DEVICE WITH ARRANGEMENT OF DUMMY INTERCONNECTIONS

TECHNICAL FIELD

An aspect of the present invention relates to an organic electroluminescent (EL) display device.

BACKGROUND

Recently, an organic EL display device using an organic EL layer as an emission section has been used as a display device (for example, see Japanese Unexamined Patent Publication No. 2001-189190). The organic EL display device includes an organic EL diode unit in which a plurality of emission sections are arranged in a lattice shape, a diode substrate and a sealing substrate configured to sandwich the organic EL diode unit, and an adhesive section configured to attach the diode substrate and the sealing substrate to surround the organic EL diode unit. A mounting section configured to mount an IC and a flexible printed circuit board is formed at one side edge section of a diode substrate disposed outside the adhesive section. Then, an extraction interconnection extracted from the organic EL diode unit crosses the adhesive region at which the adhesive section on the diode substrate is adhered and extends to the mounting section.

Japanese Unexamined Patent Publication No. 2005-019151 is another example of the above-described related art.

SUMMARY

In the above-mentioned organic EL display device, during manufacture of the organic EL display device, cracks may occur in a glass substrate or an adhesive surface may be exfoliated due to curing and contraction of the adhesive section. Here, in Japanese Unexamined Patent Publication Nos. 2001-189190 and 2005-019151, in order to solve the above-mentioned problems, a dummy interconnection formed at the adhesive section has been proposed. A technology disclosed in Japanese Unexamined Patent Publication No. 2001-189190 is a technology in which a dummy interconnection is formed at the entire region of the adhesive region in which the extraction interconnection is formed. A technology disclosed in Japanese Unexamined Patent Publication No. 2005-019151 is a technology in which an extraction interconnection and a dummy interconnection are disposed in perpendicular directions in a region of an adhesive region in which the extraction interconnection is not formed.

However, the inventor(s) has, as a result of observing an aging variation of the organic EL display device under a high temperature and a high humidity, found a phenomenon in which in the vicinity of a boundary between a region in which the extraction interconnection is not formed and a region in which the extraction interconnection is formed, the adhesive section is exfoliated. Since such a phenomenon does not appear during manufacture of the organic EL display device, the phenomenon is not caused by curing and contraction of the adhesive section.

Here, as a result of further review of the phenomenon, the following knowledge was obtained. That is, the organic EL display device can be easily influenced by humidity or temperature to be contracted according to an aging variation. Then, in the adhesive region in which the extraction interconnection is not formed, since the extraction interconnection is not formed, the adhesive section is thickened in comparison with the adhesive region in which the extraction interconnection is formed. In addition, while the adhesive region in which the extraction interconnection is formed is directly influenced by contraction of the extraction interconnection, the adhesive region in which the extraction interconnection is not formed does not directly receive an influence of contraction of the extraction interconnection. For this reason, it is considered that the adhesive section is exfoliated due to an expansion and contraction difference in both of the regions according to the aging variation of the organic EL display device.

Further, in the technology disclosed in Japanese Unexamined Patent Publication No. 2001-189190, since the adhesive section is formed on the dummy interconnection constituted by a metal or the like, an adhesion failure may occur in which an expected sufficient adhesive force is not obtained. In addition, in the technology disclosed in Japanese Unexamined Patent Publication No. 2001-189190, since the extraction interconnection and the dummy interconnection are disposed in perpendicular directions, directions of expansion and contraction are different in the adhesive region in which the extraction interconnection is formed and the adhesive region in which the dummy interconnection is formed. For this reason, in the technology disclosed in Japanese Unexamined Patent Publication No. 2001-189190 and No. 2001-189190, exfoliation of the adhesive section according to a lapse of time cannot be easily suppressed.

Here, an aspect of the present invention is directed to provide an organic EL display device capable of suppressing exfoliation of an adhesive section according to a lapse of time.

An organic EL display device according to an aspect of the present invention includes a rectangular first substrate; an organic EL diode unit formed on the first substrate; a rectangular second substrate formed on the organic EL diode unit; a frame-shaped adhesive section configured to attach the first substrate to the second substrate to surround the organic EL diode unit; an extraction interconnection group constituted by a plurality of extraction interconnections extracted from the organic EL diode unit; and a dummy interconnection group formed at an adhesive region at which the adhesive section of the first substrate is attached and constituted by a plurality of dummy interconnections that are separated from each other, wherein the extraction interconnection and the dummy interconnection cross the adhesive section in the same direction.

In the organic EL display device according to the aspect of the present invention, since the plurality of dummy interconnections that constitute the dummy interconnection group are separated from each other, an adhesive force of the adhesive section with respect to the first substrate and the second substrate can be secured. For example, when a photocuring type adhesive agent is used as the adhesive section and only light from the first substrate side can be radiated, since sufficient light can be transmitted from the apertures between the dummy interconnections, an adhesive force of the adhesive section with respect to the first substrate and the second substrate can be secured. Then, since the extraction interconnections and the dummy interconnections cross the first adhesion edge section in the same direction, directions of expansion and contraction can be matched with the adhesive region in which the extraction interconnection group is formed and the adhesive region in which the dummy interconnection group is formed. For this reason, exfoliation of the adhesive section according to a lapse of time can be suppressed.

In this case, the adhesive section may have a first adhesion edge section extending along a first side edge of the second substrate, and the extraction interconnection and the dummy interconnection may cross the first adhesion edge section in a direction perpendicular to the first side edge. When the distal ends of the dummy interconnection group are aligned to cross the first adhesion edge section in the adhesive region, the adhesive section may be exfoliated along the distal end array. On the other hand, in the organic EL display device, since the extraction interconnection and the dummy interconnection cross the first adhesion edge section in the direction perpendicular to the first side edge, exfoliation of the adhesive section with the distal end array of the dummy interconnection group as a starting point can be suppressed.

In addition, a distal end of the dummy interconnection of the first side edge side with respect to the first adhesion edge section may be disposed closer to the first side edge than the first adhesion edge section. When the distal ends of the dummy interconnection group are aligned in the adhesive region, the adhesive section may be exfoliated along the distal end array. On the other hand, in the organic EL display device, since the distal end of the first side edge side with respect to the first adhesion edge section of the dummy interconnection group is disposed outside the adhesive region, exfoliation of the adhesive section due to alignment of the distal ends of the dummy interconnection group in the adhesive region can be suppressed.

In addition, the extraction interconnection group may have: a first extraction interconnection group extracted at a central section of the first side edge when seen in a plan view; and a second extraction interconnection group extracted between the first extraction interconnection group and a second side edge adjacent to the first side edge of the second substrate when seen in the plan view, and the dummy interconnection group may have: a first dummy interconnection group disposed between the first extraction interconnection group and the second extraction interconnection group when seen in the plan view; and a second dummy interconnection group disposed between the second extraction interconnection group and the second side edge when seen in the plan view. In the organic EL display device, since the extraction interconnections and the dummy interconnections are formed throughout a region of the first adhesion edge section, the region of the first adhesion edge section that causes exfoliation of the adhesive section can be eliminated.

In addition, the adhesive section may have a second adhesion edge section extending along the second side edge, the second dummy interconnection group may extend along the second adhesion edge section, and a distal end of the second dummy interconnection group opposite the first side edge with respect to the first adhesion edge section may be disposed at a position opposite the first side edge farther than the first adhesion edge section. The substrate has a property in which corner sections can most easily absorb moisture. On the other hand, in the organic EL display device, since the distal end of the dummy interconnection group opposite the first side edge with respect to the first adhesion edge section extends to a position beyond the first adhesion edge section, exfoliation of the adhesive section due to disposition of the distal ends of the second dummy interconnection group at the corner sections in which moisture can be easily absorbed can be suppressed.

In addition, the adhesive section may have a fourth adhesion edge section extending along a fourth side edge opposite the first side edge of the second substrate, and a distal end of the second dummy interconnection group opposite the first side edge with respect to the first adhesion edge section may be disposed between a position two times a width of the first adhesion edge section from the first side edge toward the fourth side edge and a position two times a width of the fourth adhesion edge section from the fourth side edge toward the first side edge. In the organic EL display device, since the distal end is disposed between the position two times the width of the first adhesion edge section from the first side edge and the position two times the width of the fourth adhesion edge section from the fourth side edge, exfoliation of the adhesive section by disposition of the distal ends of the second dummy interconnection group at the corner sections in which moisture can be easily absorbed can be further suppressed.

In addition, distal end arrays of the second dummy interconnection group opposite the first side edge with respect to the first adhesion edge section may not be arranged in a direction perpendicular to the second side edge. When the distal ends of the dummy interconnection group are aligned in the direction perpendicular to the side edge of the substrate, the adhesive section may be exfoliated along the distal end array. On the other hand, in the organic EL display device, since the distal end arrays of the second dummy interconnection group opposite the first side edge with respect to the first adhesion edge section are not arranged in the direction perpendicular to the second side edge, exfoliation of the adhesive section due to alignment of the distal ends of the second dummy interconnection group in the direction perpendicular to the second side edge can be suppressed.

In addition, distal end arrays of the second dummy interconnection group opposite the first side edge with respect to the first adhesion edge section may be arranged in a direction inclined by 45° or more with respect to a direction perpendicular to the second side edge. In the organic EL display device, since the distal end arrays of the second dummy interconnection group opposite the first side edge with respect to the first adhesion edge section are arranged in the direction inclined by 45° or more with respect to the direction perpendicular to the second side edge, exfoliation of the adhesive section due to alignment of the distal ends of the second dummy interconnection group in the direction perpendicular to the second side edge can be suppressed.

In addition, in the adhesive region, the extraction interconnections and the dummy interconnections may be disposed at equal intervals. In the organic EL display device, since the extraction interconnections and the dummy interconnections are disposed at equal intervals in the adhesive region, expansion and contraction of the substrate in the adhesive region in which the extraction interconnections and the dummy interconnections are formed can be uniformized. Accordingly, exfoliation of the adhesive section can be further suppressed.

In addition, in the adhesive region, an error of the interval of the dummy interconnections with respect to the interval of the extraction interconnections may be 50% or less in consideration of a design value of the extraction interconnection, formation precision of the interconnections, or the like. In the organic EL display device, by setting the error of the interval of the dummy interconnections with respect to the intervals of the extraction interconnections as 50% or less, expansion and contraction of the substrate in the adhesive region in which the extraction interconnection group and the dummy interconnection group are formed can be uniformized.

In addition, a difference between sizes of the extraction interconnections and the dummy interconnections that are adjacent to each other may be 50% or less or may be 10% or less with respect to the size of the extraction interconnections. In the organic EL display device, since the difference between the sizes of the extraction interconnections and the dummy interconnections, which are adjacent to each other, is 50% or less with respect to the size of the extraction interconnections, expansion and contraction of the substrate in the adhesive region in which the extraction interconnection group and the dummy interconnection group are formed can be uniformized.

In addition, in a region in which the dummy interconnections of the adhesive region are formed, an aperture ratio of apertures formed between the dummy interconnections may be 40% to 60%. In the organic EL display device, since the aperture ratio of the dummy interconnections is 40% to 60%, an adhesive force of the adhesive section with respect to the first substrate and the second substrate can be sufficiently secured. For example, when a photocuring type adhesive agent is used as the adhesive section, since sufficient light can be transmitted from the apertures between the dummy interconnections, the adhesive force of the adhesive section with respect to the first substrate and the second substrate can be sufficiently secured.

In addition, a Young's modulus of the first substrate and the second substrate may be 1 GPa to 100 GPa. In the organic EL display device, since the Young's modulus of the first substrate and the second substrate is 1 GPa to 100 GPa, appropriate flexibility can be provided to the organic EL display device.

In addition, at least one of the first substrate and the second substrate may be a glass substrate having a thickness of 10 µm to 100 µm. In the organic EL display device, when a glass substrate is used as at least one of the first substrate and the second substrate, by setting a thickness of the glass substrate as the above-mentioned range, treatment operability of the glass substrate can be improved while securing strength of the glass substrate.

In addition, at least one of the first substrate and the second substrate may be a resin substrate having a thickness of 10 µm to 100 µm. In the organic EL display device, when a resin substrate is used as at least one of the first substrate and the second substrate, by setting a thickness of the resin substrate as the above-mentioned range, treatment operability of the resin substrate can be improved while securing strength of the resin substrate.

In addition, a drying agent filled between the first substrate and the second substrate may be further provided. In the organic EL display device, since a drying agent is filled between the first substrate and the second substrate, deterioration of the organic EL diode unit due to moisture may be suppressed.

According to the aspect of the present invention, it is possible to suppress exfoliation of an adhesive section according to a lapse of time.

DETAILED DESCRIPTION

Figure 1:
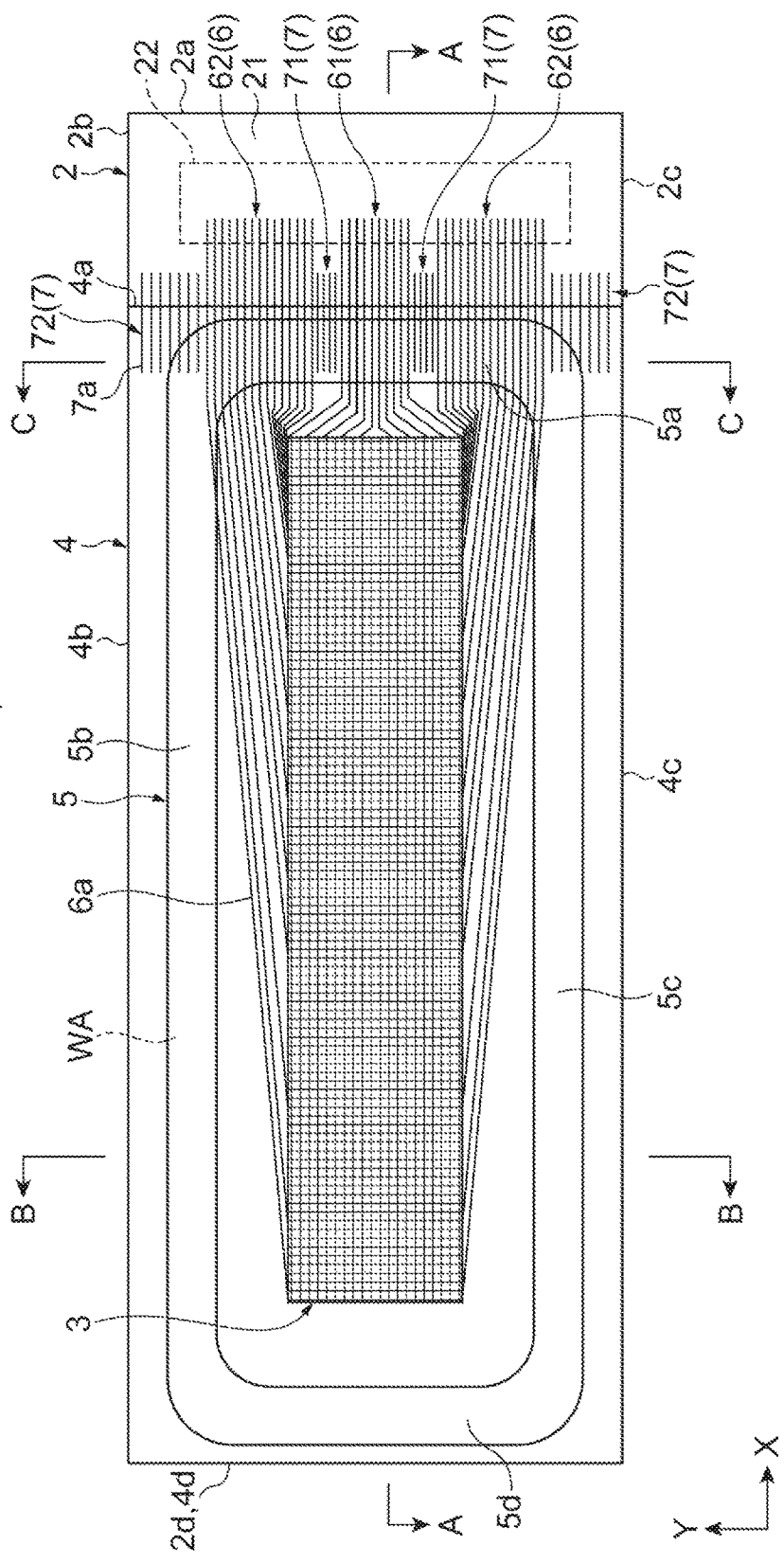
FIG. 1 is a schematic plan view of an organic EL display device of a first embodiment.

Hereinafter, appropriate embodiments of the present invention will be described with reference to the accompanying drawings. Further, directions expressed in the following description are directions in a plan view of an organic EL display device unless clearly indicated otherwise in context. In addition, the same or corresponding components in the drawings are designated by the same reference numerals, and overlapping descriptions will be omitted.

[First Embodiment]

Figure 2:
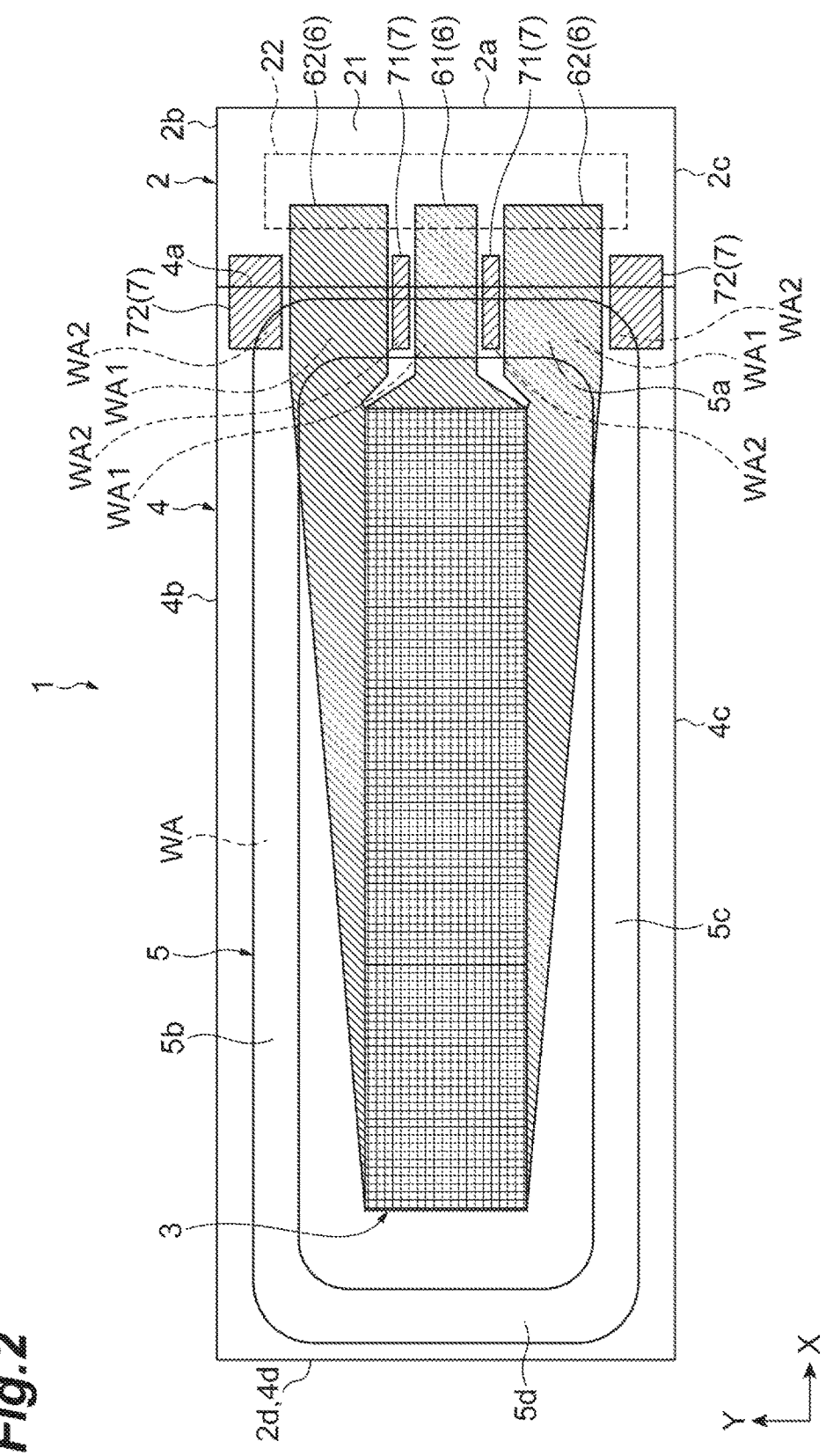
FIG. 2 is a schematic plan view of the organic EL display device in which an interconnection of FIG. 1 is simplified.
Figure 3:
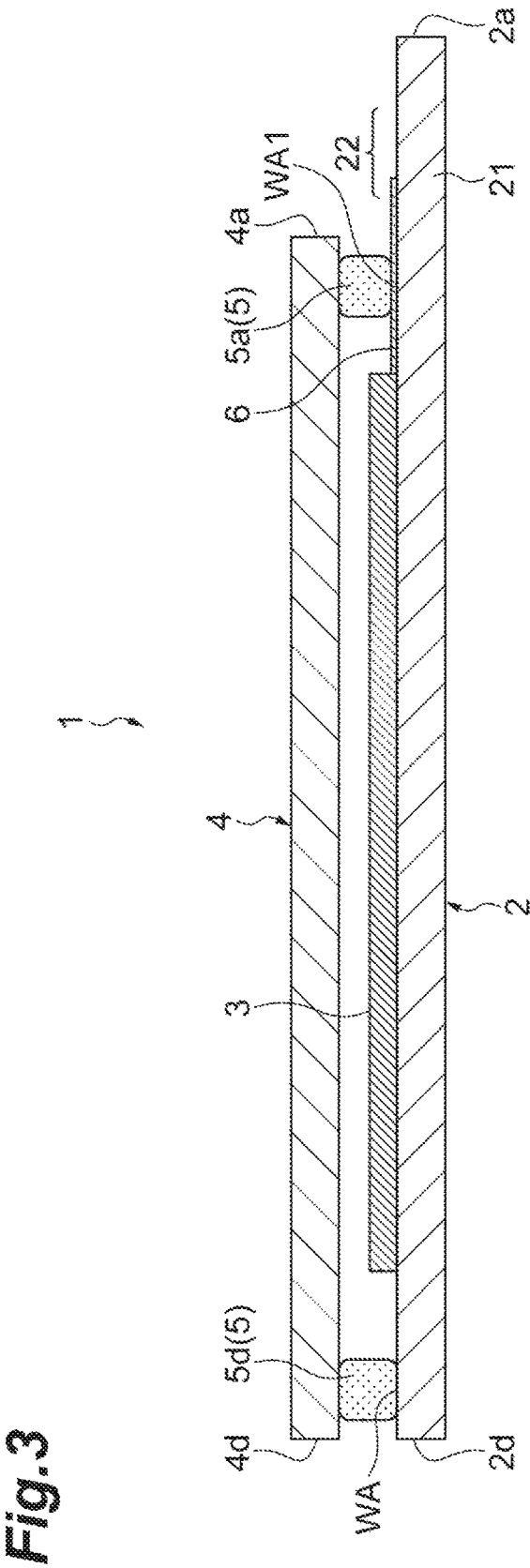
FIG. 3 is a diagrammatic cross-sectional view taken along line A-A shown in FIG. 1.
Figure 4:
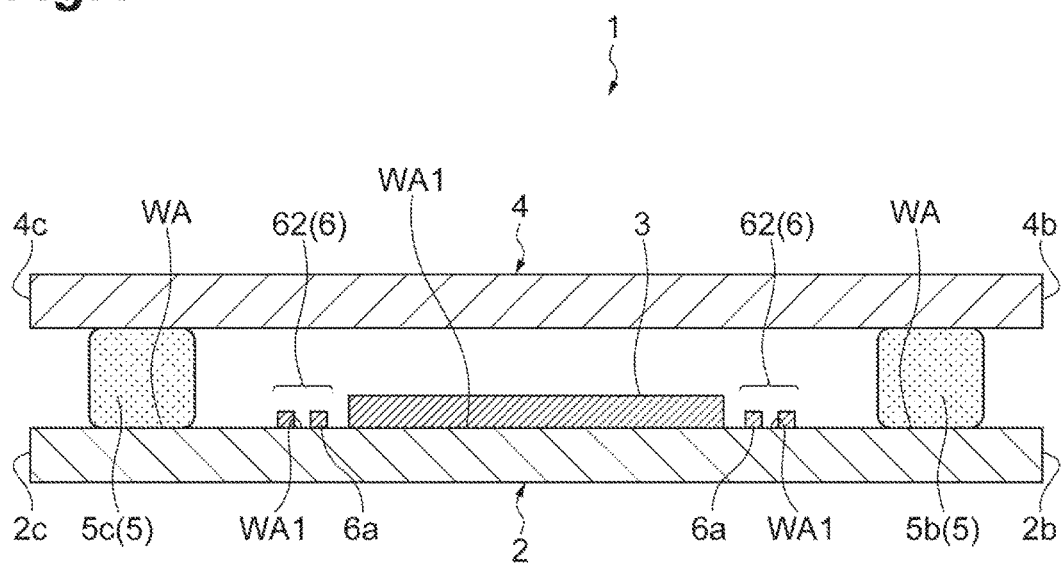
FIG. 4 is a diagrammatic cross-sectional view taken along line B-B shown in FIG. 1.
Figure 5:
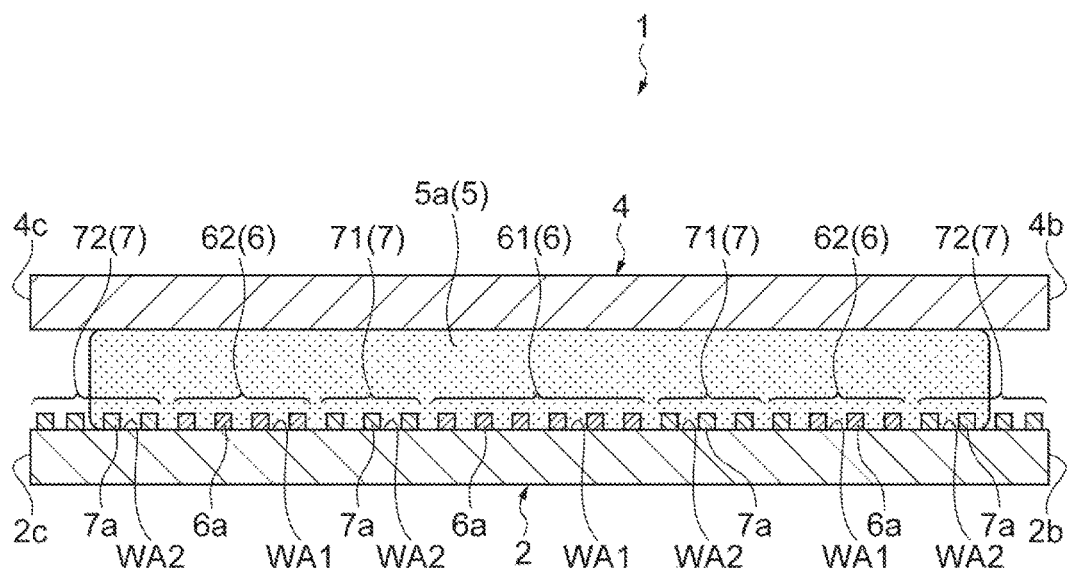
FIG. 5 is a diagrammatic cross-sectional view taken along line C-C shown in FIG. 1.
Figure 6:
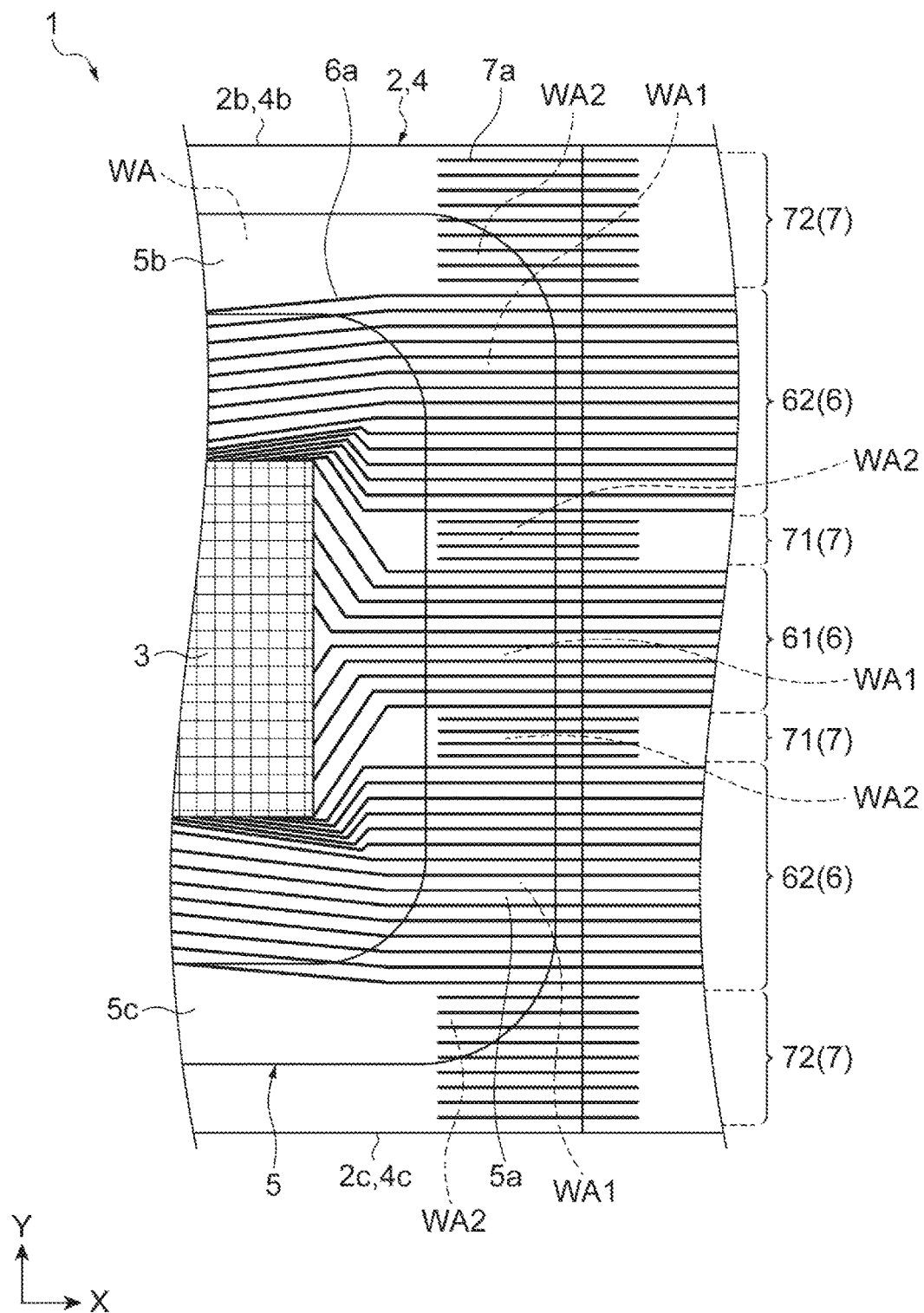
FIG. 6 is a partially enlarged view of the organic EL display device shown in FIG. 1.

FIG. 1 is a schematic plan view of an organic EL display device of a first embodiment. FIG. 2 is a schematic plan view of the organic EL display device in which an interconnection of FIG. 1 is simplified. FIG. 3 is a diagrammatic cross-sectional view taken along line A-A shown in FIG. 1. FIG. 4 is a diagrammatic cross-sectional view taken along line B-B shown in FIG. 1. FIG. 5 is a diagrammatic cross-sectional view taken along line C-C shown in FIG. 1. FIG. 6 is a partially enlarged view of the organic EL display device shown in FIG. 1. As shown in FIGS. 1 to 6, an organic EL display device 1 of the embodiment includes a first substrate 2, an organic EL diode unit 3, a second substrate 4, an adhesive section 5, an extraction interconnection group 6 and a dummy interconnection group 7. Further, in FIG. 2, regions shown by diagonal lines show the extraction interconnection group 6 or the dummy interconnection group 7.

The first substrate 2 is a substrate having a surface on which the organic EL diode unit 3 is installed. The first substrate 2 has a rectangular shape when seen in a plan view. The first substrate 2 has four edges of a first side edge 2a, a second side edge 2b, a third side edge 2c and a fourth side edge 2d when seen in a plan view.

The first side edge 2a is one of short edges of the first substrate 2. The second side edge 2b is a long edge extending in a leftward direction of FIG. 1 from an apex of one side of the first side edge 2a. The third side edge 2c is a long edge extending in the leftward direction of FIG. 1 from an apex of the other side of the first side edge 2a. The third side edge 2c is a side edge opposite the second side edge 2b, and extends in parallel to the second side edge 2b. The fourth side edge 2d is a short edge that connects an apex of the second side edge 2b opposite the first side edge 2a and an apex of the third side edge 2c opposite the first side edge 2a. The fourth side edge 2d is a side edge opposite the first side edge 2a, and extends in parallel to the first side edge 2a. Further, in the following description, a direction parallel to the first side edge 2a and the fourth side edge 2d serving as a lateral direction is referred to as a Y direction, and a direction parallel to the second side edge 2b and the third side edge 2c serving as a longitudinal direction is referred to as an X direction.

Then, the organic EL diode unit 3 is installed in a central section substantially formed by the fourth side edge 2d of the first substrate 2, and a mounting section 22 on which an IC (not shown) and a flexible printed circuit board (not shown) are mounted is formed at one side edge section 21 serving as an end section of the first side edge 2a side of the first substrate 2.

The organic EL diode unit 3 is installed on a surface of the first substrate 2 and has a plurality of emission sections (not shown). The emission sections are formed by sequentially stacking a first electrode (not shown), an organic EL layer (not shown), and a second electrode (not shown) on the surface of the substrate. Then, in the emission sections, the organic EL layer emits light as current flows to the first electrode and the second electrode. The organic EL diode unit 3 has a rectangular shape elongated in the X direction when seen in a plan view. In addition, the organic EL diode unit 3 has the plurality of emission sections arranged in a lattice shape as a plurality of first electrodes arranged in parallel and a plurality of second electrodes arranged in parallel extend in perpendicular directions. Then, the first electrodes are extracted from an end surface of the first side edge 2a side of the organic EL diode unit 3, and the second electrodes are extracted from an end surface of the second side edge 2b side and an end surface of the third side edge 2c side of the organic EL diode unit 3. Further, a general configuration can be used as the organic EL diode unit 3.

The second substrate 4 is a substrate formed on the organic EL diode unit 3 and configured to seal the organic EL diode unit 3. The second substrate 4 has a rectangular shape elongated in the X direction when seen in a plan view. The second substrate 4 has four edges of a first side edge 4a, a second side edge 4b, a third side edge 4c and a fourth side edge 4d when seen in a plan view.

The first side edge 4a is one of short edges of the second substrate 4. The second side edge 4b is a long edge extending in the leftward direction of FIG. 1 from an apex of one side of the first side edge 4a. The third side edge 4c is a long edge extending in the leftward direction of FIG. 1 from an apex of the other side of the first side edge 2a. The third side edge 4c is a side edge opposite the second side edge 4b, and extends in parallel to the second side edge 4b. The fourth side edge 4d is a short edge that connects an apex of the second side edge 4b opposite the first side edge 4a and an apex of the third side edge 4c opposite the first side edge 4a. The fourth side edge 4d is a side edge opposite the first side edge 4a, and extends in parallel to the first side edge 4a.

The first side edge 4a and the fourth side edge 4d serving as the short edges of the second substrate 4 have the same length as the first side edge 2a and the fourth side edge 2d serving as the short edges of the first substrate 2. Meanwhile, the second side edge 4b and the third side edge 4c serving as the long edges of the second substrate 4 are shorter than the second side edge 2b and the third side edge 2c serving as the long edges of the first substrate 2. Then, when seen in a plan view, the first substrate 2 and the second substrate 4 overlap each other such that the mounting section 22 of the first substrate 2 is exposed at the second substrate 4.

At least one of the first substrate 2 and the second substrate 4 has transparency. While the first substrate 2 and the second substrate 4 may not have flexibility, the first substrate 2 and the second substrate 4 preferably have flexibility. In this case, the first substrate 2 and the second substrate 4 are preferably formed of a material having a Young's modulus of 1 GPa to 100 GPa. Specifically, a glass substrate, various resin substrates, or the like may be used as the first substrate 2 and the second substrate 4. When at least one of the first substrate 2 and the second substrate 4 is a glass substrate, a thickness of the used glass substrate is preferably 10 µm to 100 µm. Meanwhile, when at least one of the first substrate 2 and the second substrate 4 is a resin substrate, a thickness of the used resin substrate is preferably 10 µm to 300 µm. When resin substrates are used as the first substrate 2 and the second substrate 4, for example, a plastic substrate or the like formed of one or a plurality of materials selected from a group consisting of polyethylene terephthalate (PET), polyethersulfone (PES), polycarbonate (PC), nylon, polyetheretherketone (PEEK), polysulfone (PSF), polyetherimide (PEI), polyarylate (PAR), polybutylene terephthalate (PBT) and polyimide is used as the resin material. In addition, the first substrate 2 and the second substrate 4 are preferably formed of a material having a Young's modulus of 1 GPa to 100 GPa.

The adhesive section 5 attaches the first substrate 2 to the second substrate 4. Further, in a surface of the second substrate 4 side of the first substrate 2, a region at which the adhesive section 5 is adhered is referred to as an adhesive region WA. The adhesive section 5 has a frame shape that surrounds the organic EL diode unit 3 when seen in a plan view. The adhesive section 5 has four edge sections of a first adhesion edge section 5a, a second adhesion edge section 5b, a third adhesion edge section 5c and a fourth adhesion edge section 5d.

The first adhesion edge section 5a linearly extends along the first side edge 4a (the first side edge 2a). The second adhesion edge section 5b linearly extends along the second side edge 4b (the second side edge 2b). The third adhesion edge section 5c linearly extends along the third side edge 4c (the third side edge 2c). The fourth adhesion edge section 5d linearly extends along the fourth side edge 4d (the fourth side edge 2d). Further, shapes of a corner section (a corner portion) connected to the first adhesion edge section 5a and the second adhesion edge section 5b, a corner section connected to the first adhesion edge section 5a and the third adhesion edge section 5c, a corner section connected to the second adhesion edge section 5b and the fourth adhesion edge section 5d, and a corner section connected to the third adhesion edge section 5c and the fourth adhesion edge section 5d are not particularly limited. For example, the shapes of the corner sections may be a shape bent in a curve shape (a curved shape), a shape bent at a right angle, or a shape bent in a polygonal shape.

For example, an epoxy-based adhesive agent, an acryl-based adhesive agent, or an olefin-based adhesive agent may be used as the adhesive section 5.

Further, a drying agent (not shown) may be filled in a space sealed by the organic EL diode unit 3 between the first substrate 2 and the second substrate 4. The space sealed by the organic EL diode unit 3 is a space surrounded by the first substrate 2, the second substrate 4 and the adhesive section 5. For example, a physical drying agent such as zeolite, silica gel, carbon, a carbon nano tube, or the like, a chemical drying agent such as alkali metal oxide, metal halide, chlorine peroxide, or the like, a drying agent obtained by dissolving an organometallic complex in petroleum solvents such as toluene, xylene, aliphatic organic solvent, or the like, or a drying agent obtained by dispersing drying agent particles in a binder such as polyethylene, polyisoprene, polyvinyl cinnamate, or the like having transparency may be used as the drying agent.

The extraction interconnection group 6 is constituted by a plurality of extraction interconnections 6a extracted from the organic EL diode unit 3. The extraction interconnections 6a are formed on a surface of the first substrate 2. The extraction interconnection group 6 has a first extraction interconnection group 61 extracted at a central section of the first side edge 4a when seen in a plan view, and a pair of second extraction interconnection groups 62 extracted between the first extraction interconnection group 61 and the second side edge 4b or the third side edge 4c when seen in a plan view. A portion between the first extraction interconnection group 61 and the second side edge 4b is referred to as the second side edge 4b side, and a portion between the first extraction interconnection group 61 and the third side edge 4c is referred to as the third side edge 4c side. The pair of second extraction interconnection groups 62 is constituted by one of the second extraction interconnection groups 62 disposed at the second side edge 4b side and the other second extraction interconnection group 62 disposed at the third side edge 4c side.

The first extraction interconnection group 61 is constituted by the plurality of extraction interconnections 6a extracted from the first electrode of the organic EL diode unit 3. The extraction interconnections 6a that constitute the first extraction interconnection group 61 are extracted from the end surface of the first side edge 4a side of the organic EL diode unit 3 and extend toward the first side edge 4a while reducing intervals therebetween. Then, the extraction interconnections 6a that constitute the first extraction interconnection group 61 are arranged in parallel, and cross the first adhesion edge section 5a in a direction perpendicular to the first side edge 4a (the X direction) in the central section in the Y direction. Further, the extraction interconnections 6a that constitute the first extraction interconnection group 61 extend to the mounting section 22 in a state in which the intervals therebetween are maintained.

The second extraction interconnection group 62 is constituted by the plurality of extraction interconnections 6a extracted from the second electrode of the organic EL diode unit 3. The extraction interconnections 6a extracted from the end surface of the second side edge 2b side of the organic EL diode unit 3 extend toward the first side edge 4a while reducing the intervals therebetween from the apexes of the long edge of the second side edge 2b side and the short edge of the fourth side edge 2d side of the organic EL diode unit 3. Then, the extraction interconnections 6a are arranged in parallel to cross the first adhesion edge section 5a in the direction perpendicular to the first side edge 4a (the X direction) between the first extraction interconnection group 61 and the second side edge 4b and extend to the mounting section 22. The extraction interconnections 6a extracted from the end surface of the third side edge 2c side of the organic EL diode unit 3 extend toward the first side edge 4a while reducing the intervals therebetween from the apexes of the long edge of the third side edge 2c side and the short edge of the fourth side edge 2d side of the organic EL diode unit 3. Then, the extraction interconnections 6a are arranged in parallel, cross the first adhesion edge section 5a in the direction perpendicular to the first side edge 4a (the X direction) between the first extraction interconnection group 61 and the third side edge 4c, and extend to the mounting section 22.

The dummy interconnection group 7 is formed at the adhesive region WA of the first substrate 2, and is constituted by a plurality of dummy interconnections 7a separated from each other. The dummy interconnections 7a are formed on the surface of the first substrate 2. In addition, the dummy interconnections 7a are connected to none of the organic EL diode unit 3, the mounting section 22 and the extraction interconnections 6a. Then, when distal ends of the dummy interconnection group 7 are aligned to cross the first adhesion edge section 5a in the adhesive region WA, the adhesive section 5 may be exfoliated along the distal end array. Here, the dummy interconnections 7a that constitute the dummy interconnection group 7 are disposed to cross the first adhesion edge section 5a in the direction perpendicular to the first side edge 4a (the X direction).

More specifically, the dummy interconnection group 7 has a pair of first dummy interconnection groups 71 disposed between the first extraction interconnection group 61 and the pair of second extraction interconnection groups 62 and a pair of second dummy interconnection groups 72 disposed between the second extraction interconnection group 62 and the second side edge 4b or the third side edge 4c such that the extraction interconnections 6a and the dummy interconnections 7a are formed throughout the region of the first adhesion edge section 5a in the Y direction. The pair of first dummy interconnection groups 71 is constituted by one of the first dummy interconnection groups 71 disposed at the second side edge 4b side and the other first dummy interconnection group 71 disposed at the third side edge 4c side. The pair of second dummy interconnection groups 72 is constituted by one of the second dummy interconnection groups 72 disposed at the second side edge 4b side and the other second dummy interconnection group 72 disposed at the third side edge 4c side.

The dummy interconnections 7a that constitute one of the first dummy interconnection groups 71 linearly extend in the X direction in parallel between the first extraction interconnection group 61 and the second extraction interconnection group 62 of the second side edge 4b side. Then, the dummy interconnections 7a cross the first adhesion edge section 5a in the direction perpendicular to the first side edge 4a.

The dummy interconnections 7a that constitute the other first dummy interconnection group 71 linearly extend in the X direction in parallel between the first extraction interconnection group 61 and the second extraction interconnection group 62 of the third side edge 4c side. Then, the dummy interconnections 7a cross the first adhesion edge section 5a in the direction perpendicular to the first side edge 4a.

A distal end of the first side edge 4a side (a distal end of a right side of FIG. 6) of the first dummy interconnection group 71 with respect to the first adhesion edge section 5a is disposed closer to the first side edge 2a than the first adhesion edge section 5a. A distal end of the first dummy interconnection group 71 opposite the first side edge 4a (a distal end of a left side of FIG. 6) with respect to the first adhesion edge section 5a is disposed in the first adhesion edge section 5a. Then, when imaginary lines that connect the distal ends of the dummy interconnections 7a belonging to the first dummy interconnection group 71 are distal end arrays, the distal end arrays of both sides of the first dummy interconnection group 71 are arranged in a direction perpendicular to the second side edge 4b.

The dummy interconnections 7a that constitute one of the second dummy interconnection groups 72 linearly extend in the X direction in parallel at a side opposite the first extraction interconnection group 61 of the second extraction interconnection group 62 of the second side edge 2b side. Then, the dummy interconnections 7a cross the first adhesion edge section 5a in the direction perpendicular to the first side edge 4a.

The dummy interconnections 7a that constitute the other second dummy interconnection group 72 linearly extend in the X direction in parallel at a side opposite the first extraction interconnection group 61 of the second extraction interconnection group 62 of the third side edge 2c side. Then, the dummy interconnections 7a cross the first adhesion edge section 5a in the direction perpendicular to the first side edge 4a.

A distal end of the second dummy interconnection group 72 of the first side edge 4a side (a distal end of a right side of FIG. 6) with respect to the first adhesion edge section 5a is disposed closer to the first side edge 2a than the first adhesion edge section 5a. A distal end of the second dummy interconnection group 72 opposite the first side edge 4a (a distal end of a left side of FIG. 6) with respect to the first adhesion edge section 5a is disposed in the first adhesion edge section 5a. Then, when imaginary lines that connect the distal ends of the dummy interconnections 7a belonging to the second dummy interconnection group 72 are distal end arrays, the distal end array of the first side edge 4a side and a side opposite the first side edge 4a of the second dummy interconnection group 72 are arranged in the direction perpendicular to the second side edge 4b.

The extraction interconnections 6a and the dummy interconnections 7a are disposed at equal intervals in the adhesive region WA. Here, the equal intervals include an error range that is seemingly substantially the same, as well as all of the equal intervals. The error range that is seemingly substantially the same is a range in which an error of the interval of the dummy interconnections 7a with respect to the interval of the extraction interconnections 6a in the adhesive region WA is 50% or less.

While a size (a width) of the extraction interconnections 6a and a size (a width) of the dummy interconnections 7a are preferably the same, the sizes may be different. When the size of the extraction interconnections 6a is different from the size of the dummy interconnections 7a, at least a difference between the sizes of the extraction interconnections 6a and the dummy interconnections 7a, which are adjacent to each other, among the plurality of extraction interconnections 6a and the plurality of dummy interconnections 7a is preferably 50% or less with respect to the size of the extraction interconnections 6a, and more preferably is 10% or less.

Here, in the adhesive region WA, a region in which the extraction interconnection group 6 is formed is referred to as an extraction interconnection region WA1, and a region in which the dummy interconnection group 7 is formed is referred to as a dummy interconnection region WA2. As described above, since the dummy interconnections 7a are separated from each other, an aperture (a gap) having a predetermined width is formed between the dummy interconnections 7a. Here, in the dummy interconnection region WA2, an aperture ratio of apertures formed between the dummy interconnections 7a is 40% to 60%, and is preferably 50%. The aperture ratio is a percentage of an area of the apertures formed between the dummy interconnections 7a in the dummy interconnection region WA2 with respect to an area of the dummy interconnection region WA2.

While the material of the extraction interconnections 6a may be different from the material of the dummy interconnections 7a, the materials may be the same. In addition, while a timing of forming the extraction interconnections 6a on the first substrate 2 may be different from a timing of forming the dummy interconnections 7a, the timings may be equal to each other. Accordingly, since a process of forming the extraction interconnection group 6 and the dummy interconnection group 7 can be performed at one time, manufacturing cost of the organic EL display device 1 can be reduced.

In this way, in the organic EL display device 1 according to the embodiment, since the plurality of dummy interconnections 7a that constitute the dummy interconnection group 7 are separated from each other, an adhesive force of the adhesive section 5 with respect to the first substrate 2 and the second substrate 4 can be secured. For example, when a photocuring type adhesive agent is used as the adhesive section 5 and only light from the first substrate 2 side can be radiated, since sufficient light is transmitted from the apertures between the dummy interconnections 7a, the adhesive force of the adhesive section 5 with respect to the first substrate 2 and the second substrate 4 can be secured. Then, since the extraction interconnections 6a and the dummy interconnections 7a cross the first adhesion edge section 5a in the same direction, directions of expansion and contraction can be matched by the extraction interconnection region WA1 in which the extraction interconnection group 6 is formed and the dummy interconnection region WA2 in which the dummy interconnection group 7 is formed. For this reason, exfoliation of the adhesive section 5 according to a lapse of time can be suppressed.

In addition, in the organic EL display device 1, since the extraction interconnections 6a and the dummy interconnections 7a cross the first adhesion edge section 5a in the direction perpendicular to the first side edge 4a, exfoliation of the adhesive section 5 with the distal end array of the dummy interconnection group 7 as a starting point can be suppressed.

In addition, in the organic EL display device 1, since the distal end of the dummy interconnections 7a of the first side edge 4a side with respect to the first adhesion edge section 5a is disposed outside the adhesive region WA, exfoliation of the adhesive section 5 due to alignment of the distal ends of the dummy interconnection group 7 in the adhesive region WA can be suppressed.

In addition, in the organic EL display device 1, since the extraction interconnections 6a and the dummy interconnections 7a can be formed through a region of the first adhesion edge section 5a, the region of the first adhesion edge section 5a that causes exfoliation of the adhesive section 5 can be eliminated.

In addition, in the organic EL display device 1, since the extraction interconnections 6a and the dummy interconnections 7a are disposed at equal intervals in the adhesive region WA, expansion and contraction of the first substrate 2 and the second substrate 4 in the extraction interconnection region WA1 and the dummy interconnection region WA2 can be uniformized. Accordingly, exfoliation of the adhesive section 5 can be further suppressed.

Further, in the organic EL display device 1, by setting an error of the interval of the dummy interconnections 7a with respect to the interval of the extraction interconnections 6a as 50% or less, expansion and contraction of the first substrate 2 and the second substrate 4 in the extraction interconnection region WA1 and the dummy interconnection region WA2 can be uniformized.

In addition, in the organic EL display device 1, since a difference between the sizes of the extraction interconnections 6a and the dummy interconnections 7a is 50% or less with respect to the size of the extraction interconnections 6a, expansion and contraction of the first substrate 2 and the second substrate 4 in the extraction interconnection region WA1 and the dummy interconnection region WA2 can be uniformized. Accordingly, exfoliation of the adhesive section 5 can be further suppressed.

In addition, in the organic EL display device 1, since the aperture ratio of the dummy interconnections 7a is 40% to 60%, the adhesive force of the adhesive section 5 with respect to the first substrate 2 and the second substrate 4 can be sufficiently secured. For example, when a photocuring type adhesive agent is used as the adhesive section 5, since sufficient light is transmitted from the apertures between the dummy interconnections 7a, the adhesive force of the adhesive section 5 with respect to the first substrate 2 and the second substrate 4 can be sufficiently secured.

In addition, in the organic EL display device 1, since the Young's modulus of the first substrate 2 and the second substrate 4 is 1 GPa to 100 GPa, appropriate flexibility can be provided to the organic EL display device 1.

In addition, in the organic EL display device 1, when a glass substrate is used as at least one of the first substrate 2 and the second substrate 4, as a thickness of the glass substrate is in the above-mentioned range, treatment operability of the glass substrate can be improved while securing strength of the glass substrate.

Meanwhile, in the organic EL display device 1, when a resin substrate is used as at least one of the first substrate 2 and the second substrate 4, by setting a thickness of the resin substrate as the above-mentioned range, treatment operability of the resin substrate can be improved while securing strength of the resin substrate.

In addition, in the organic EL display device 1, by filling a drying agent between the first substrate 2 and the second substrate 4, the organic EL diode unit 3 can be suppressed from being deteriorated due to humidity.

(Second embodiment)

Next, an organic EL display device of a second embodiment will be described. While the organic EL display device of the second embodiment is basically the same as the organic EL display device of the first embodiment, only a disposition of the dummy interconnection is distinguished from the organic EL display device of the first embodiment. For this reason, hereinafter, only different parts from the organic EL display device of the first embodiment will be described, and descriptions of the same parts as the organic EL display device of the first embodiment will be omitted.

Figure 7:
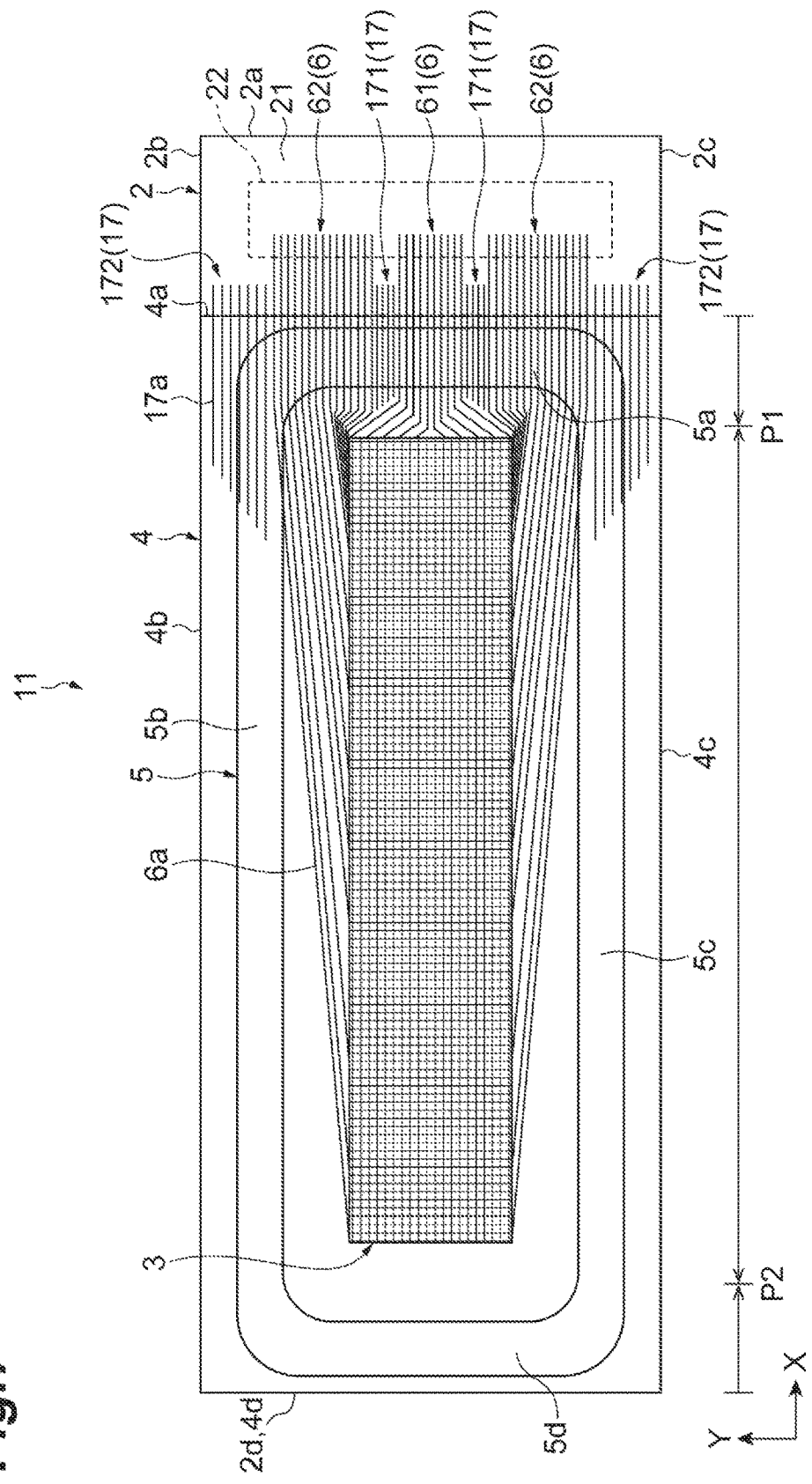
FIG. 7 is a schematic plan view of an organic EL display device of a second embodiment.
Figure 8:
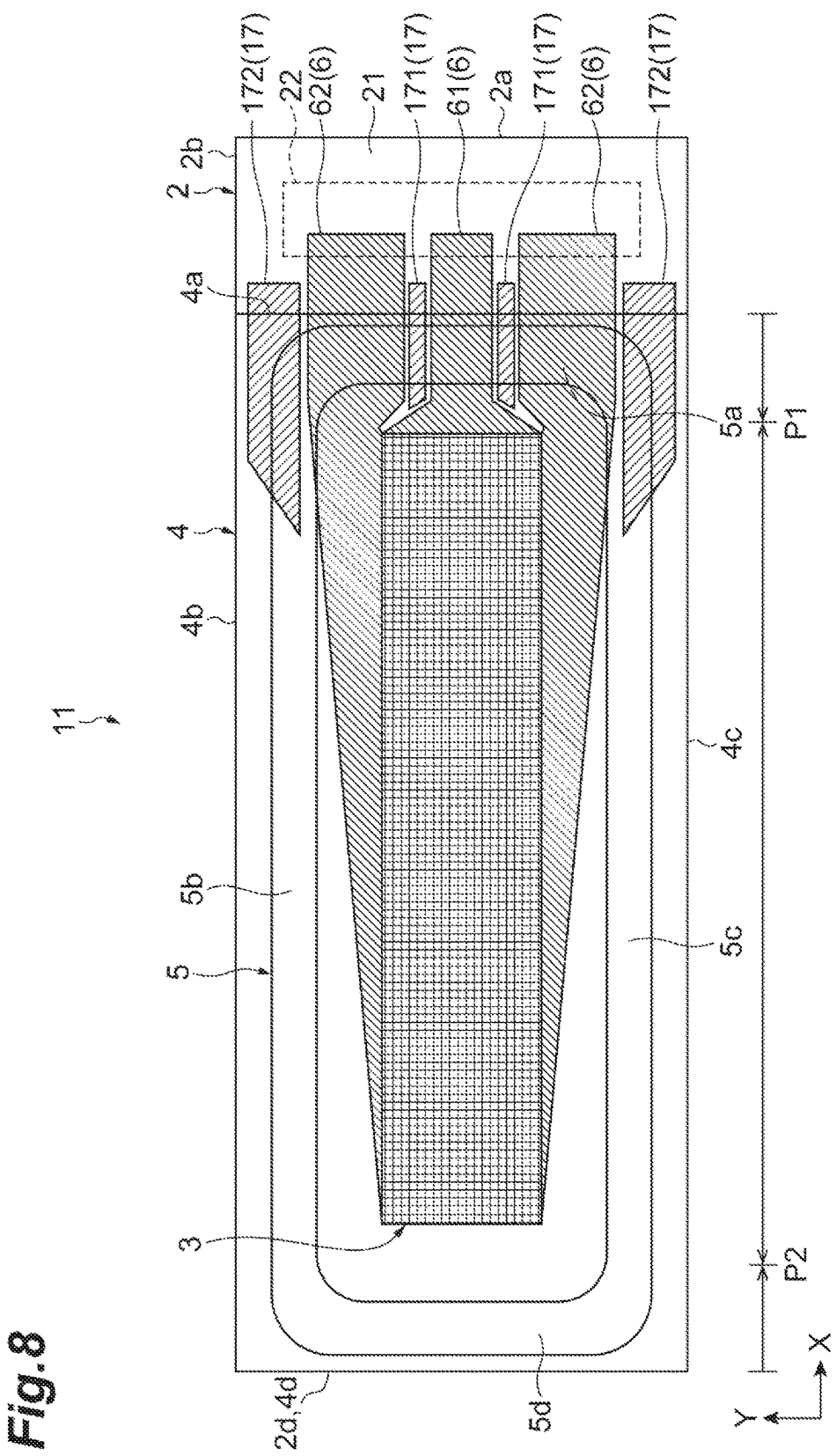
FIG. 8 is a schematic plan view of the organic EL display device in which an interconnection of FIG. 7 is simplified.
Figure 9:
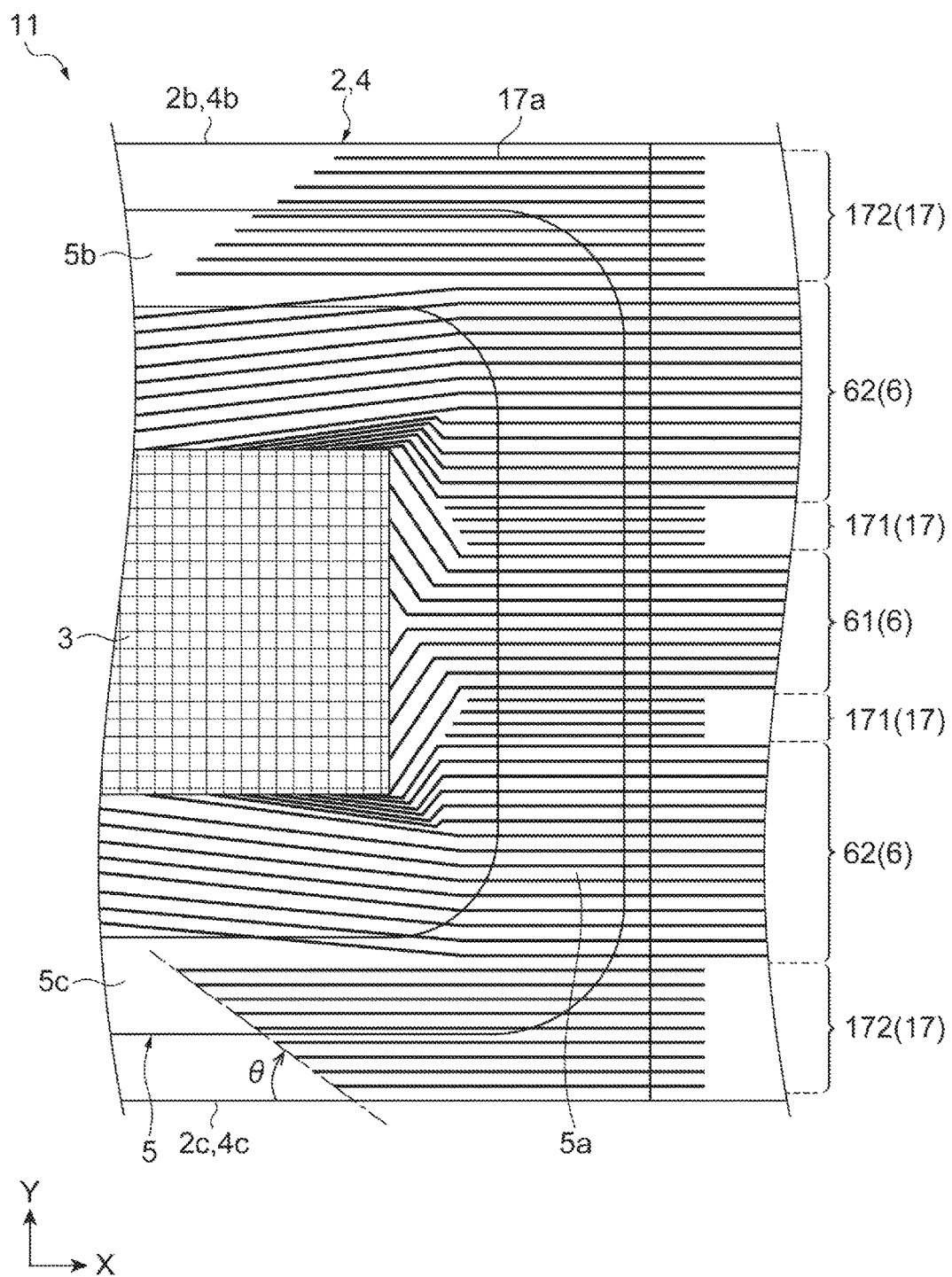
FIG. 9 is a partially enlarged view of the organic EL display device shown in FIG. 7.

FIG. 7 is a schematic plan view of the organic EL display device of the second embodiment. FIG. 8 is a schematic plan view of the organic EL display device in which interconnections in FIG. 7 are simplified. FIG. 9 is a partially enlarged view of the organic EL display device shown in FIG. 7. As shown in FIGS. 7 to 9, an organic EL display device 11 of the embodiment includes the first substrate 2, the organic EL diode unit 3, the second substrate 4, the adhesive section 5, the extraction interconnection group 6 and a dummy interconnection group 17. Further, in FIG. 8, a region in which diagonal lines are drawn shows the extraction interconnection group 6 or the dummy interconnection group 17.

The dummy interconnection group 17 has a pair of first dummy interconnection groups 171 disposed between the first extraction interconnection group 61 and the pair of second extraction interconnection groups 62, and a pair of second dummy interconnection groups 172 disposed between the second extraction interconnection group 62 and the second side edge 4b or the third side edge 4c and extending along the second adhesion edge section 5b or the third adhesion edge section 5c. The first dummy interconnection group 171 and the second dummy interconnection group 172 correspond to the first dummy interconnection group 71 and the second dummy interconnection group 72 of the first embodiment. Then, only positions of distal ends of the first dummy interconnection group 171 and the second dummy interconnection group 172 in the X direction are different from that of the first dummy interconnection group 71 and the second dummy interconnection group 72 of the first embodiment.

Dummy interconnections 17a that constitute the first dummy interconnection group 171 linearly extend in the X direction in parallel to each other. Then, the dummy interconnections 17a cross the first adhesion edge section 5a in a direction perpendicular to the first side edge 4a.

A distal end of the first dummy interconnection group 171 of the first side edge 4a side (a distal end of a right side of FIG. 9) with respect to the first adhesion edge section 5a is disposed closer to the first side edge 2a than the first adhesion edge section 5a. A distal end of the first dummy interconnection group 171 opposite the first side edge 4a (a distal end of a left side of FIG. 9) with respect to the first adhesion edge section 5a is disposed at an opposite side of the first side edge 2a farther than the first adhesion edge section 5a. That is, in the second embodiment, both ends of the dummy interconnections 17a that constitute the first dummy interconnection group 171 are disposed outside the first adhesion edge section 5a.

Then, when imaginary lines that connect the distal ends of the dummy interconnections 17a belonging to the first dummy interconnection group 171 are distal end arrays, the distal end arrays of the first side edge 4a side with respect to the first adhesion edge section 5a of the first dummy interconnection group 171 are arranged in a direction perpendicular to the second side edge 4b. Meanwhile, distal end arrays of the first dummy interconnection group 171 opposite the first side edge 4a with respect to the first adhesion edge section 5a are arranged in a direction inclined with respect to the direction perpendicular to the second side edge 4b such that a distance to the first extraction interconnection group 61 is constant.

The dummy interconnections 17a that constitute the second dummy interconnection group 172 linearly extend in the X direction in parallel. Then, the dummy interconnections 17a cross the first adhesion edge section 5a in the direction perpendicular to the first side edge 4a.

A distal end of the second dummy interconnection group 172 of the first side edge 4a side (a distal end of a right side of FIG. 9) with respect to the first adhesion edge section 5a is disposed closer to the first side edge 2a than the first adhesion edge section 5a. A distal end of the second dummy interconnection group 172 opposite the first side edge 4a (a distal end of a left side of FIG. 9) with respect to the first adhesion edge section 5a is disposed at an opposite side of the first side edge 2a farther than the first adhesion edge section 5a.

Incidentally, since the first substrate 2 and the second substrate 4 have properties in which corner sections can most easily absorb moisture, the distal end of the second dummy interconnection group 172 is preferably not disposed at the corner sections in which moisture can be easily absorbed. Here, while the distal end of the second dummy interconnection group 172 opposite the first side edge 4a with respect to the first adhesion edge section 5a is disposed in the second adhesion edge section 5b or the third adhesion edge section 5c, the distal end is disposed at a position opposite the first side edge 2a farther than the first adhesion edge section 5a. Moreover, in this case, the distal end is preferably disposed at a position opposite the first side edge 4a farther than the corner sections of the first adhesion edge section 5a and the second adhesion edge section 5b or the third adhesion edge section 5c. Further, the distal end is preferably disposed between a position P1 two times a width of the first adhesion edge section 5a from the first side edge 4a toward the fourth side edge 4d and a position P2 two times a width of the fourth adhesion edge section 5d from the fourth side edge 4d toward the first side edge 4a.

Then, when imaginary lines that connect the distal ends of the dummy interconnections 17a belonging to the second dummy interconnection group 172 are distal end arrays, the distal end arrays of the second dummy interconnection group 172 of the first side edge 4a side with respect to the first adhesion edge section 5a are disposed in the direction perpendicular to the second side edge 4b. Meanwhile, the distal end arrays of the second dummy interconnection group 172 opposite the first side edge 4a with respect to the first adhesion edge section 5a are not arranged in a direction perpendicular to the second side edge 4b or the third side edge 4c. A linear shape, a curved shape, or the like may be provided as a disposition type of the distal end arrays. When the distal end arrays are disposed in a linear shape, for example, the distal end arrays are preferably arranged in a direction inclined by 45° or more with respect to the direction perpendicular to the second side edge 4b or the third side edge 4c. Further, the drawing shows the case in which the distal end arrays are inclined by 45° with respect to the direction perpendicular to the second side edge 4b or the third side edge 4c.

In this way, in the organic EL display device 11 according to the embodiment, since the distal end of the dummy interconnection group 17 opposite the first side edge 4a with respect to the first adhesion edge section 5a extends to a position beyond the first adhesion edge section 5a, exfoliation of the adhesive section 5 can be suppressed by disposing the distal end of the second dummy interconnection group 172 at the corner section at which moisture can be easily absorbed.

In addition, in the organic EL display device 11, since the distal end is disposed between the position P1 two times the width of the first adhesion edge section 5a from the first side edge 4a toward the fourth side edge 4d and the position P2 two times the width of the fourth adhesion edge section 5d from the fourth side edge 4d toward the first side edge 4a, exfoliation of the adhesive section 5 can be further suppressed by disposing the distal end of the second dummy interconnection group 172 at the corner section at which moisture can be easily absorbed.

In addition, in the organic EL display device 11, since the distal end arrays of the second dummy interconnection group 172 opposite the first side edge 4a with respect to the first adhesion edge section 5a are not arranged in the direction perpendicular to the second side edge 4b or the third side edge 4c, exfoliation of the adhesive section 5 due to alignment of the distal ends of the second dummy interconnection group 172 in the direction perpendicular to the second side edge 4b or the third side edge 4c can be suppressed.

In addition, in the organic EL display device 11, since the distal end arrays of the second dummy interconnection group 172 opposite the first side edge 4a with respect to the first adhesion edge section 5a are arranged in a direction inclined by 45° or more with respect to the direction perpendicular to the second side edge 4b or the third side edge 4c, exfoliation of the adhesive section 5 due to alignment of the distal ends of the second dummy interconnection group 172 in the direction perpendicular to the second side edge 4b or the third side edge 4c can be suppressed.

Hereinabove, while the appropriate embodiments of the present invention have been described, the present invention is not limited to the embodiments.

For example, in the embodiment, while a specific disposition, the number, or the like of the extraction interconnection groups and the dummy interconnection groups are particularly described, the disposition of the extraction interconnection groups and the dummy interconnection groups can be appropriately varied. For example, the extraction interconnection groups and the dummy interconnection groups may be extracted at two or more side edges other than one side edge. In addition, each of the extraction interconnection group and the dummy interconnection group may be singular or plural in number.

In addition, in the first embodiment, while the distal end of the first dummy interconnection group 71 opposite the first side edge 4a with respect to the first adhesion edge section 5a has been described as being disposed in the first adhesion edge section 5a, like the second embodiment, the distal end may be disposed at a position opposite the first side edge 4a farther than the first adhesion edge section 5a. In this case, like the second embodiment, the distal end arrays of the first dummy interconnection group 71 opposite the first side edge 4a with respect to the first adhesion edge section 5a can be arranged in a direction inclined with respect to the direction perpendicular to the second side edge 4b such that a distance to the first extraction interconnection group 61 is constant.

Figure 10:
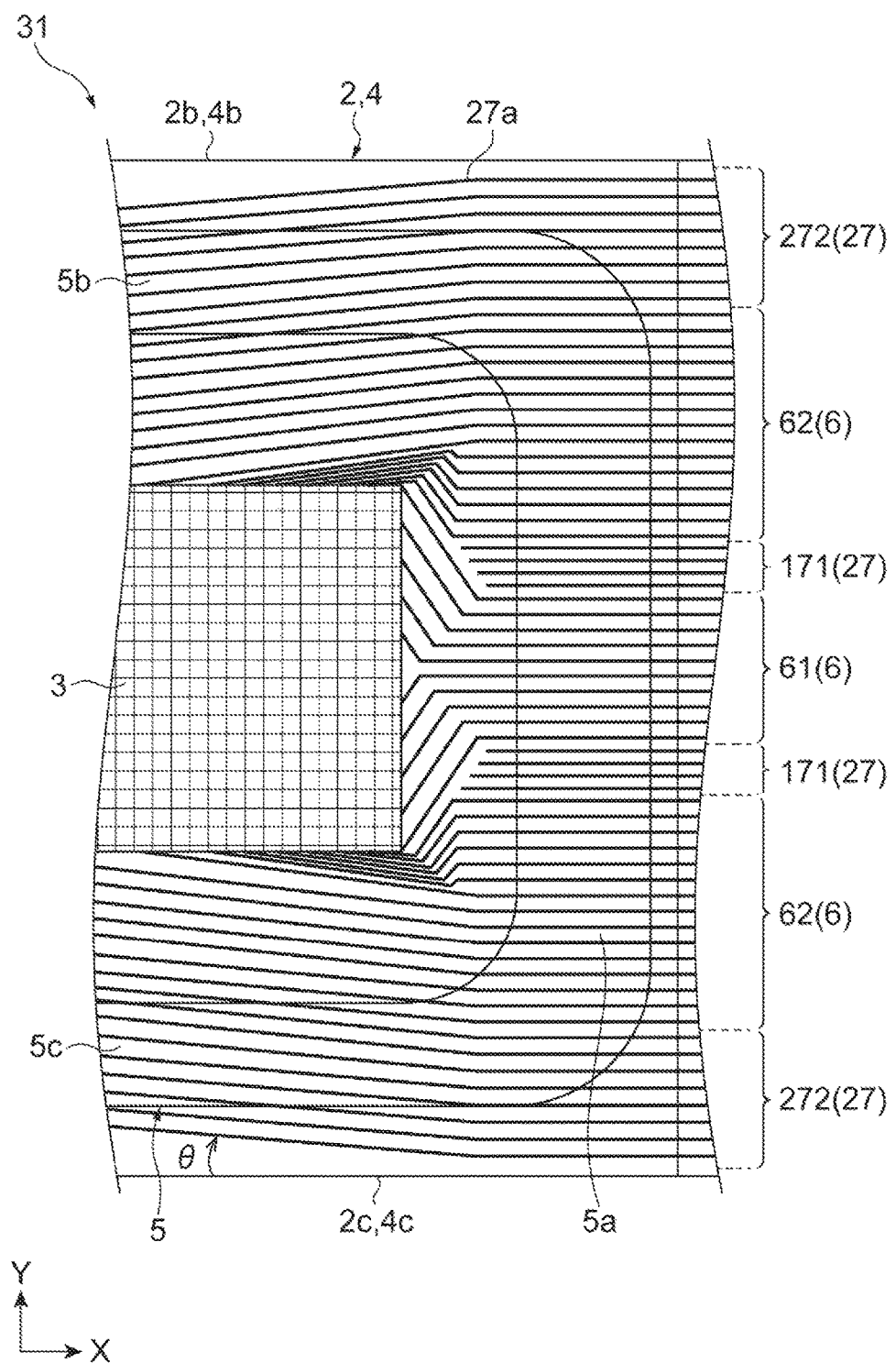
FIG. 10 is a partially enlarged view of a modified organic EL display device.

In addition, in the second embodiment, while the distal end arrays of the second dummy interconnection group 172 opposite the first side edge 4a with respect to the first adhesion edge section 5a have been described as not being arranged in the direction perpendicular to the second side edge 4b or the third side edge 4c, like an organic EL display device 31 which will be shown in FIG. 10, dummy interconnections 27a that constitute a second dummy interconnection group 272 of a dummy interconnection group 27 may be inclined with respect to the second side edge 4b or the third side edge 4c in the second adhesion edge section 5b or the third adhesion edge section 5c. In this case, the second dummy interconnection group 272 is preferably inclined in the same direction as the second extraction interconnection group 62.

EXAMPLE

Hereinafter, examples of the present invention will be described, but the present invention is not limited to the following examples.

Comparative Example 1

Figure 11:
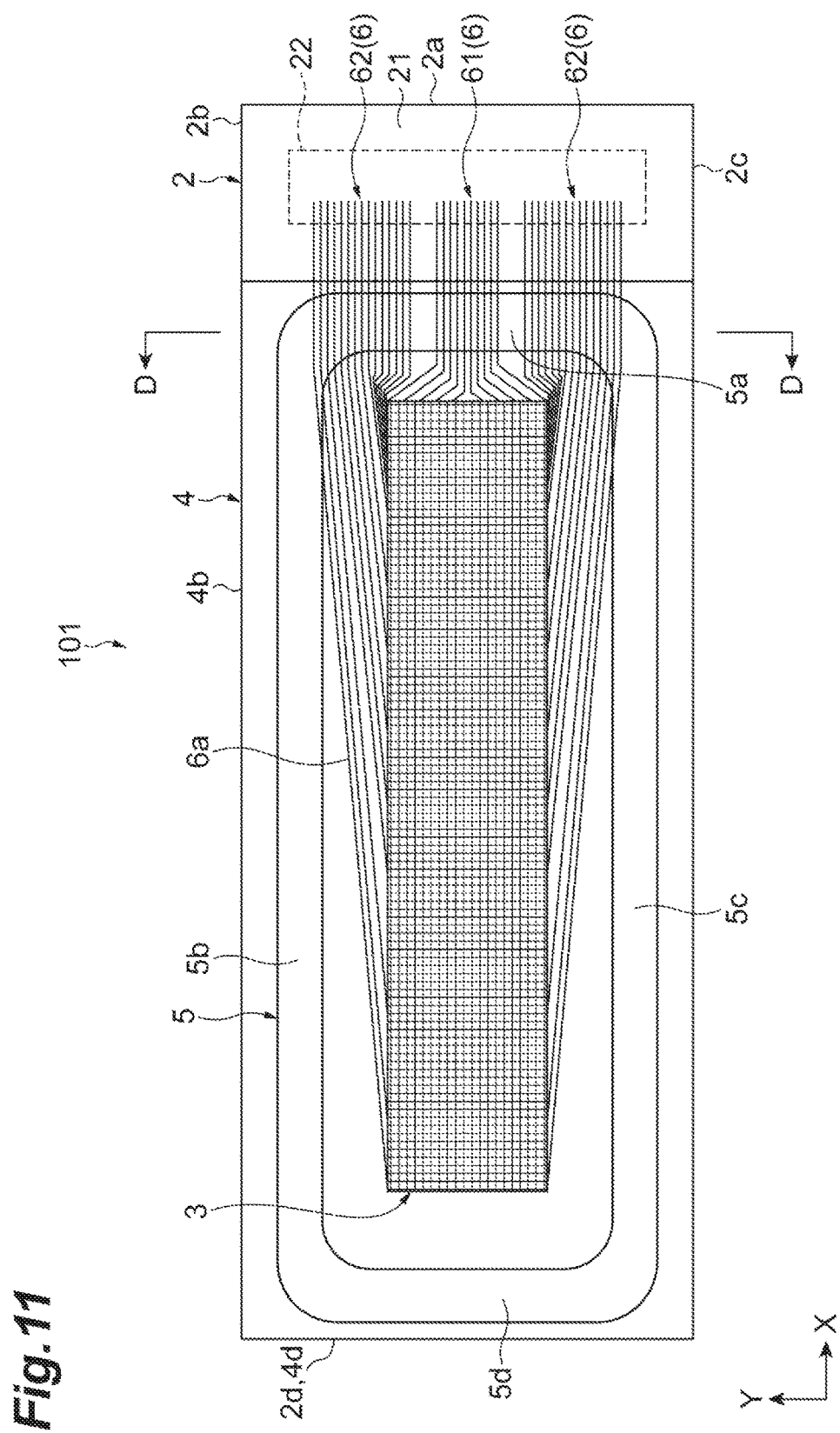
FIG. 11 is a partially enlarged view of an organic EL display device of Comparative example 1.
Figure 12:
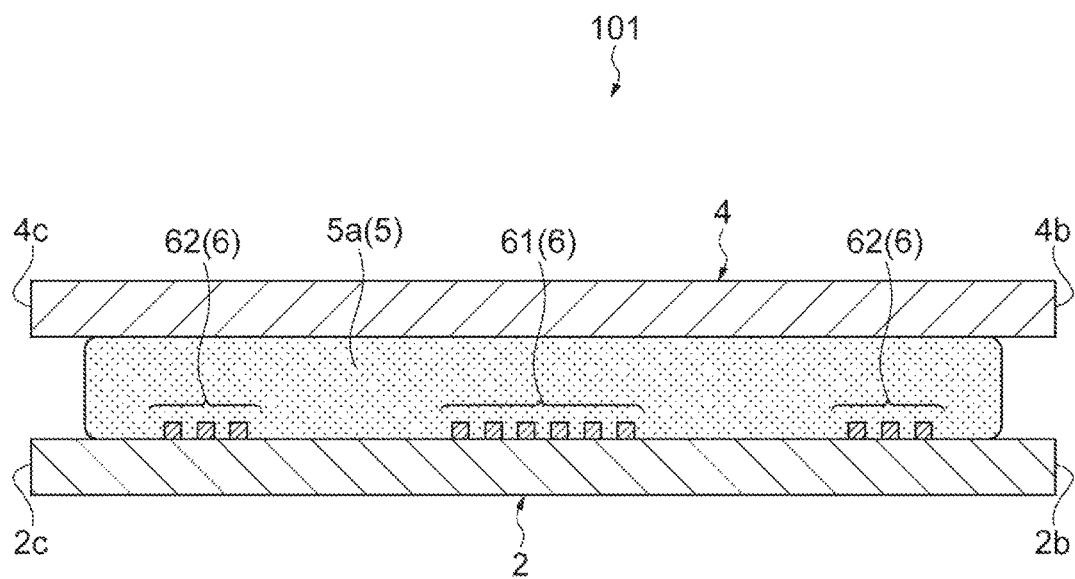
FIG. 12 is a diagrammatic cross-sectional view taken along line D-D shown in FIG. 11.

FIG. 11 is a partially enlarged view of an organic EL display device of Comparative example 1. FIG. 12 is a diagrammatic cross-sectional view taken along line D-D shown in FIG. 11. As shown in FIGS. 11 and 12, while an organic EL display device 101 of Comparative example 1 is basically the same as the organic EL display device 1 according to the first embodiment, the organic EL display device 101 is distinguished from the organic EL display device 1 according to the first embodiment in that no dummy interconnections are formed.

A rectangular substrate having a thickness of 100 μm, a long edge of 45 mm and a short edge of 10 mm was manufactured as the first substrate 2. A rectangular substrate having thickness of 100 μm, a long edge of 40 mm and a short edge of 10 mm was manufactured as the second substrate 4. Then, the organic EL diode unit 3 and the extraction interconnection group 6 were formed on the first substrate 2, and the first substrate 2 and the second substrate 4 were adhered by the adhesive section 5. An epoxy-based adhesive agent was used as the adhesive section 5. A MAM interconnection formed of a laminated layer of a Mo (molybdenum) alloy/an Al (aluminum) alloy/a Mo alloy was used as the extraction interconnection group 6. An interval of the extraction interconnections 6a in the first adhesion edge section 5a was 10 μm. A size of the extraction interconnections 6a was 10 μm.

Then, the organic EL display device 101 of Comparative example 1 was left under an environment of a temperature of 60° and a humidity of 95% for 400 hours, and an exfoliation situation of the adhesive section 5 was observed.

Example 1

In Example 1, the organic EL display device 1 according to the first embodiment was used. The organic EL display device 1 of Example 1 was manufactured in the same way as the organic EL display device 101 of Comparative example 1 except that the dummy interconnection group 7 was formed on the first substrate 2 when the organic EL diode unit 3 and the extraction interconnection group 6 were formed on the first substrate 2. The MAM interconnection was used as the dummy interconnection group 7. An interval of the dummy interconnection groups 7 in the first adhesion edge section 5a was 10 μm. A size of the dummy interconnection group 7 was 10 μm.

Then, the organic EL display device 1 of Example 1 was left under the environment of a temperature of 60° and a humidity of 95% for 400 hours, and an exfoliation situation of the adhesive section 5 was observed.

Example 2

In Example 2, the organic EL display device 11 according to the second embodiment was used. The organic EL display device 11 of Example 2 was manufactured through the same method as that of the organic EL display device 1 of Example 1.

Then, the organic EL display device 11 of Example 2 was left under the environment of a temperature 60° and a humidity 95% for 400 hours, and an exfoliation situation of the adhesive section 5 was observed.

(Estimation)

Figure 13:
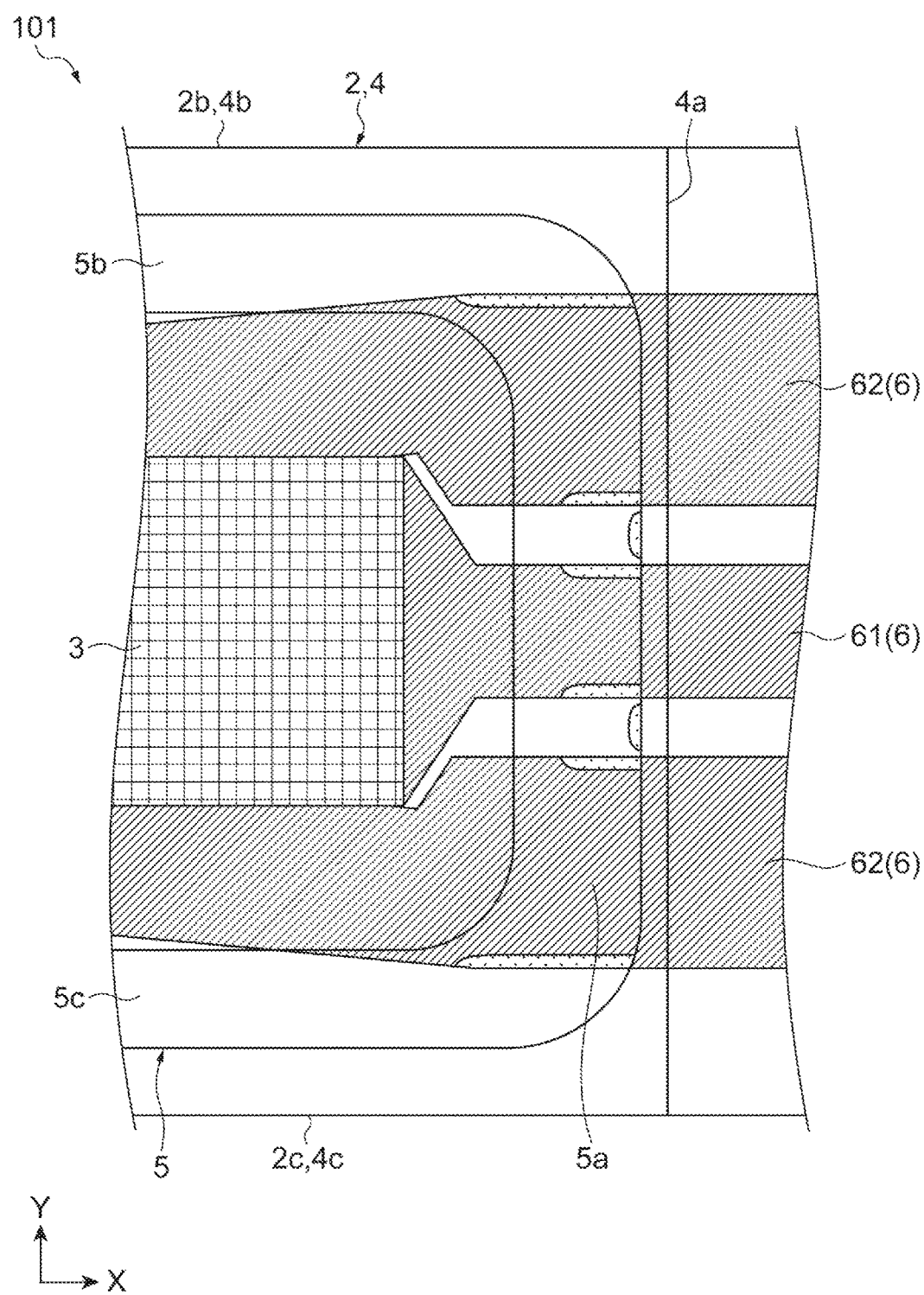
FIG. 13 is a view showing an observation result of Comparative example 1.
Figure 14:
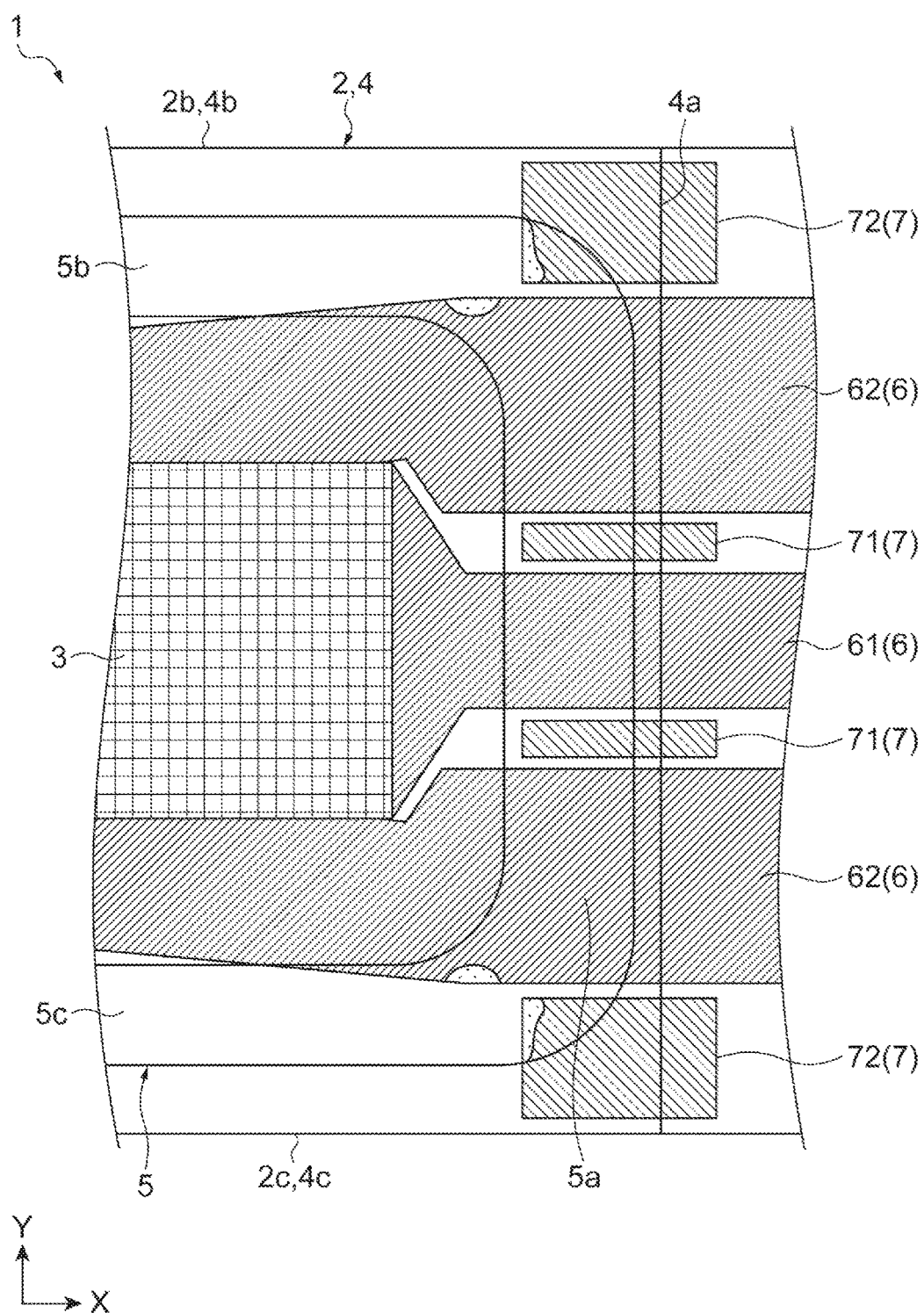
FIG. 14 is a view showing an observation result of Example 1.
Figure 15:
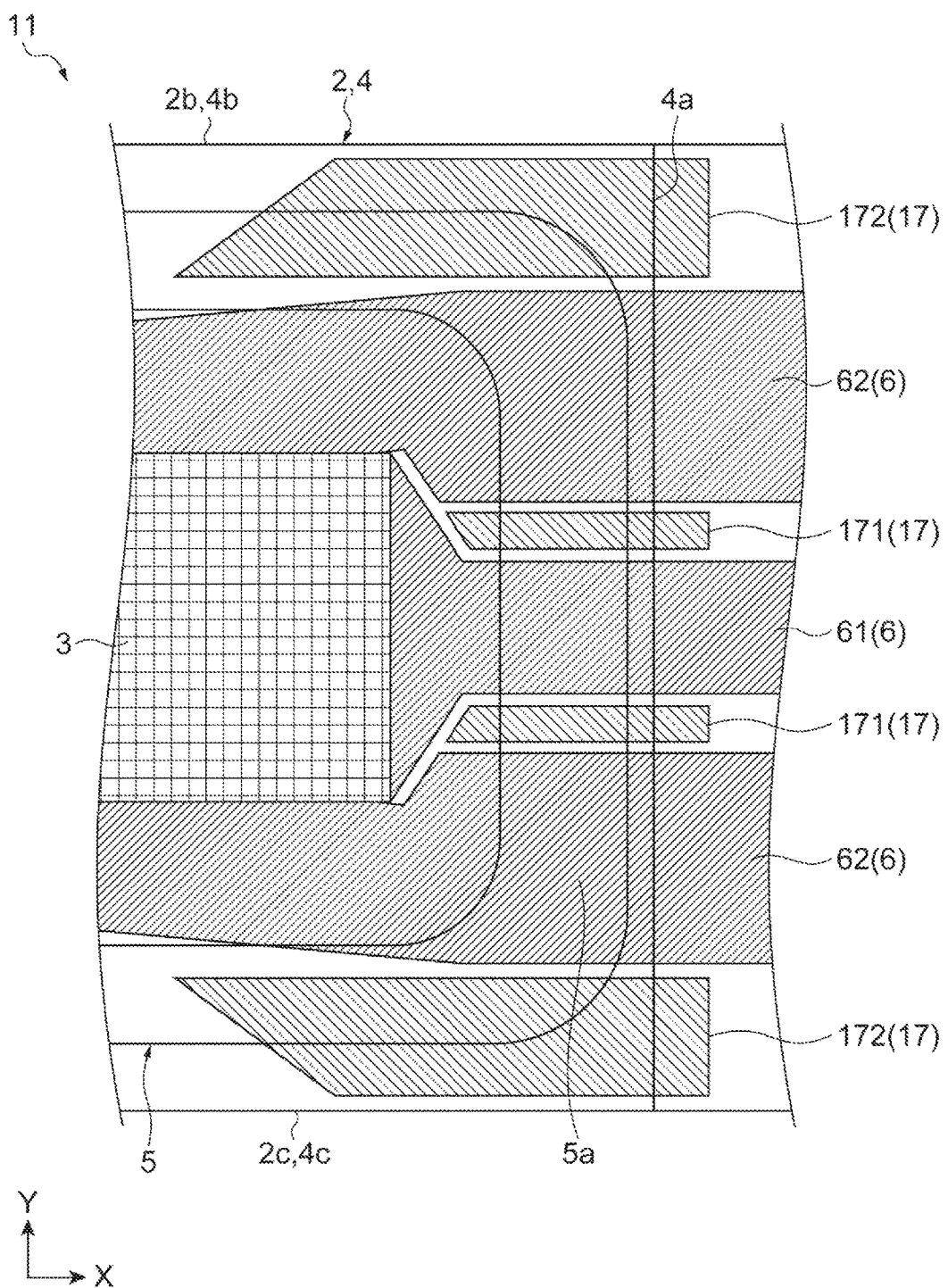
FIG. 15 is a view showing an observation result of Example 2.

FIG. 13 is a view showing an observation result of Comparative example 1. FIG. 14 is a view showing an observation result of Example 1. FIG. 15 is a view showing an observation result of Example 2. In FIGS. 13 to 15, regions of the extraction interconnection group 6, the dummy interconnection group 7 and the dummy interconnection group 17 are shown by diagonal lines, and regions in which the adhesive section 5 was exfoliated are shown by dotted areas.

As shown in FIG. 13, in Comparative example 1, from a time after a lapse of 240 hours, an exfoliation phenomenon of the adhesive section 5 occurred from a place at which the extraction interconnection group 6 is not formed and an end section of the extraction interconnection group 6.

As shown in FIG. 14, in Example 1, the exfoliation phenomenon did not occur even in the place where the exfoliation phenomenon occurred in Comparative example 1. As a result, it should be appreciated that, as the dummy interconnection group 7 is formed, exfoliation of the adhesive section according to an aging variation can be reduced.

Incidentally, in Example 1, in the corner sections of the second substrate 4, in the second extraction interconnection group 62 and in the second dummy interconnection group 72, the exfoliation phenomenon of the adhesive section 5 occurred. It is considered that, since end sections of the second extraction interconnection group 62 and the second dummy interconnection group 72 are formed in the corner sections of the second substrate 4 in which moisture can be easily absorbed, the exfoliation phenomenon occurs at the end sections of the second extraction interconnection group 62 and the second dummy interconnection group 72 due to an absorption of moisture in the corner sections of the second substrate 4.

As shown in FIG. 15, in Example 2, the exfoliation phenomenon occurred even in the place in which the exfoliation phenomenon occurred in Example 1. As a result, it should be appreciated that, as the distal ends of the second dummy interconnection group 172 are not formed at the corner sections of the second substrate 4, exfoliation of the adhesive section according to the aging variation can be further suppressed.

What is claimed is:

1. An organic electroluminescent display device comprising:
   a rectangular first substrate;
   an organic electroluminescent diode unit formed on the first substrate;
   a rectangular second substrate formed on the organic electroluminescent diode unit;
   a frame-shaped adhesive section configured to attach the first substrate to the second substrate and to surround the organic electroluminescent diode unit, the adhesive section having a first adhesion edge section extending along a first side edge of the second substrate;
   a first extraction interconnection group and a second extraction interconnection group that each comprise a plurality of extraction interconnections extracted from the organic electroluminescent diode unit, the first extraction interconnection group extracted at a central section of the first side edge of the second substrate when seen in a plan view of the organic electroluminescent display device, and the second extraction interconnection group extracted between the first extraction interconnection group and a second side edge of the second substrate adjacent to the first side edge of the second substrate when seen in the plan view;
   a first dummy interconnection group formed at an adhesive region of the first substrate at which the adhesive section is attached to the first substrate and comprising a plurality of dummy interconnections that are separated from each other; and
   a second dummy interconnection group comprising a plurality of dummy interconnections that are separated from each other, the second dummy interconnection group disposed between the second extraction interconnection group and the second side edge of the second substrate when seen in the plan view,
   wherein the extraction interconnections and the dummy interconnections of the first dummy interconnection group exit the adhesive section in the same direction, and the extraction interconnections and the dummy interconnections of the first dummy interconnection group exit the first adhesion edge section in a direction perpendicular to the first side edge of the second substrate, the first dummy interconnection group is disposed between the first extraction interconnection group and the second extraction interconnection group in the plan view, the second substrate has an opposite side edge that is opposite of the first side edge of the second substrate, and the adhesive section has an opposite adhesion edge section extending along the opposite side edge of the second substrate, the organic electroluminescent diode unit is located between the opposite adhesion edge section and the first adhesion edge section in the plan view, the first adhesion edge section is located between the organic electroluminescent diode unit and the first side edge of the second substrate in the plan view, the first side edge of the second substrate is located between the first adhesion edge section and a first side edge of the first substrate in the plan view, the adhesive section has a second adhesion edge section extending along the second side edge of the second substrate in the plan view, and the second dummy interconnection group extends along the second adhesion edge section, each of the dummy interconnections of the second dummy interconnection group formed at a starting point located between the opposite adhesion edge section and the first side edge of the second substrate in the plan view and extending to an ending point located between the first side edge of the second substrate and the first side edge of the first substrate in the plan view.

2. The organic electroluminescent display device according to claim 1, wherein the first adhesion edge section is located between the organic electroluminescent diode unit and the first side edge of the second substrate in the plan view, the first side edge of the second substrate is located between the first adhesion edge section and a first side edge of the first substrate in the plan view, and the dummy interconnections of the first dummy interconnection group extend from the first adhesion edge section toward the first side edge of the first substrate across the first side edge of the second substrate in the plan view.

3. The organic electroluminescent display device according to claim 1, wherein a distance between the starting point and the first side edge of the second substrate is two times longer than a width of the first adhesion edge section, and a distance between the starting point and the opposite side edge of the second substrate is two times longer than a width of the opposite adhesion edge section.

4. The organic electroluminescent display device according to claim 1, wherein an imaginary line connecting each of the starting points is arranged at an inclined angle to the second side edge of the second substrate.

5. The organic electroluminescent display device according to claim 1, wherein an imaginary line connecting each of the starting points is arranged in a direction inclined by 45° or more with respect to a direction perpendicular to the second side edge of the second substrate.

6. The organic electroluminescent display device according to claim 1, wherein, in the adhesive region, the extraction interconnections and the dummy interconnections of the first dummy interconnection group are disposed at equal intervals.

7. The organic electroluminescent display device according to claim 6, wherein, in the adhesive region, an error of the interval of the dummy interconnections of the first dummy interconnection group with respect to the interval of the extraction interconnections is 50% or less.

8. The organic electroluminescent display device according to claim 1, wherein a difference between widths of the extraction interconnections and the dummy interconnections of the first dummy interconnection group that are adjacent to each other is 50% or less with respect to the width of the extraction interconnections.

9. The organic electroluminescent display device according to claim 1, wherein, in a region of the adhesive region in which the dummy interconnections of the first dummy interconnection group are formed, apertures formed between the dummy interconnections of the first dummy interconnection group provide an aperture ratio of 40% to 60%.

10. The organic electroluminescent display device according to claim 1, wherein a Young's modulus of the first substrate and the second substrate is 1 GPa to 100 GPa.

11. The organic electroluminescent display device according to claim 1, wherein at least one of the first substrate and the second substrate is a glass substrate having a thickness of 10 μm to 100 μm.

12. The organic electroluminescent display device according to claim 1, wherein at least one of the first substrate and the second substrate is a resin substrate having a thickness of 10 μm to 300 μm.

13. The organic electroluminescent display device according to claim 1, further comprising a drying agent filled between the first substrate and the second substrate.

14. An organic electroluminescent display device comprising:
a first substrate;
a second substrate mounted to the first substrate by an adhesive section, the adhesive section having a first adhesion edge section extending along a first side edge of the second substrate;
an organic electroluminescent diode unit located between the first substrate and the second substrate and at least partially surrounded by the adhesive section;
a first extraction interconnection group and a second extraction interconnection group that each comprise a plurality of extraction interconnections extending from the organic electroluminescent diode unit, the first extraction interconnection group extracted at a central section of the first side edge of the second substrate when seen in a plan view of the organic electroluminescent display device, and the second extraction interconnection group extracted between the first extraction interconnection group and a second side edge of the second substrate adjacent to the first side edge of the second substrate when seen in the plan view;
a first dummy interconnection group comprising spaced-apart dummy interconnections that are located between the first extraction interconnection group and the second extraction interconnection group in the plan view; and
a second dummy interconnection group comprising spaced-part dummy interconnections, the second dummy interconnection group disposed between the second extraction interconnection group and the second side edge of the second substrate when seen in the plan view, wherein the extraction interconnections and the dummy interconnections of the first dummy interconnection group exit the adhesive section in the same direction,
the extraction interconnections and the dummy interconnections of the first dummy interconnection group exit the first adhesion edge section in a direction perpendicular to the first side edge of the second substrate,
the second substrate has an opposite side edge that is opposite of the first side edge of the second substrate, and the adhesive section has an opposite adhesion edge section extending along the opposite side edge of the second substrate,
the organic electroluminescent diode unit is located between the opposite adhesion edge section and the first adhesion edge section in the plan view,
the first adhesion edge section is located between the organic electroluminescent diode unit and the first side edge of the second substrate in the plan view,
the first side edge of the second substrate is located between the first adhesion edge section and a first side edge of the first substrate in the plan view,
the adhesive section has a second adhesion edge section extending along the second side edge of the second substrate in the plan view, and
the second dummy interconnection group extends along the second adhesion edge section, each of the dummy interconnections of the second dummy interconnection group formed at a starting point located between the opposite adhesion edge section and the first side edge of the second substrate in the plan view and extending to an ending point located between the first side edge of the second substrate and the first side edge of the first substrate in the plan view.

15. The organic electroluminescent display device according to claim 14, wherein the first extraction interconnection group is physically separated from the second extraction interconnection group by a width of the first dummy interconnection group in the plan view.

16. The organic electroluminescent display device according to claim 14, wherein the organic electroluminescent diode unit comprises a plurality of first electrodes and a plurality of second electrodes arranged perpendicular to the plurality of first electrodes,
the extraction interconnections of the first extraction interconnection group comprise extraction interconnections extracted from the plurality of first electrodes, and
the extraction interconnections of the second extraction interconnection group comprise extraction interconnections extracted from the plurality of second electrodes.

17. The organic electroluminescent display device according to claim 14, wherein the dummy interconnections of the second dummy interconnection group have unequal lengths.

* * * * *